United States Patent
Sugimoto et al.

(10) Patent No.: US 12,402,417 B2
(45) Date of Patent: Aug. 26, 2025

(54) SOLAR CELL, MULTI-JUNCTION SOLAR CELL SOLAR CELL MODULE, AND PHOTOVOLTAIC POWER GENERATION SYSTEM

(71) Applicants: KABUSHIKI KAISHA TOSHIBA, Tokyo (JP); TOSHIBA ENERGY SYSTEMS & SOLUTIONS CORPORATION, Kawasaki (JP)

(72) Inventors: Kanta Sugimoto, Yokohama Kanagawa (JP); Yukitami Mizuno, Tokyo (JP); Kazushige Yamamoto, Yokohama Kanagawa (JP); Mutsuki Yamazaki, Yokohama Kanagawa (JP); Naoyuki Nakagawa, Tokyo (JP); Soichiro Shibasaki, Tokyo (JP); Yasutaka Nishida, Tokyo (JP); Yuya Honishi, Saitama Saitama (JP)

(73) Assignees: KABUSHIKI KAISHA TOSHIBA, Tokyo (JP); TOSHIBA ENERGY SYSTEMS & SOLUTIONS CORPORATION, Kawasaki (JP)

( * ) Notice: Subject to any disclaimer, the term of this patent is extended or adjusted under 35 U.S.C. 154(b) by 27 days.

(21) Appl. No.: 18/462,456

(22) Filed: Sep. 7, 2023

(65) Prior Publication Data
US 2023/0420592 A1 Dec. 28, 2023

Related U.S. Application Data

(63) Continuation of application No. PCT/JP2022/013553, filed on Mar. 23, 2022.

(51) Int. Cl.
*H10F 10/14* (2025.01)
(52) U.S. Cl.
CPC .................. *H10F 10/14* (2025.01)

(58) Field of Classification Search
CPC ..... H01L 31/04; H01L 31/068; H01L 31/072; H10F 10/14
See application file for complete search history.

(56) References Cited

U.S. PATENT DOCUMENTS

2017/0301738 A1* 10/2017 Abe ................. H10K 50/11
2020/0006583 A1* 1/2020 Shibasaki ....... H01L 31/022425
(Continued)

FOREIGN PATENT DOCUMENTS

| CN | 110112225 | 8/2019 |
| JP | 2014-170865 | 9/2014 |

(Continued)

OTHER PUBLICATIONS

International Search Report and Written Opinion for International Application No. PCT/JP2022/013553 mailed on Apr. 26, 2022, 8 pgs.

(Continued)

*Primary Examiner* — Mayla Gonzalez Ramos
(74) *Attorney, Agent, or Firm* — Amin, Turocy & Watson, LLP

(57) ABSTRACT

A solar cell according to an embodiment includes a p-electrode, an n-electrode, a p-type light-absorbing layer on the p-electrode, and an n-type layer between the p-type light-absorbing layer and the n-electrode. A first region is included in the p-type light-absorbing layer from a surface on the n-type layer side toward the p-electrode. The first region includes n-type dopant. A thickness of the first region is 1500 [nm] or more and a thickness of the p-type light-absorbing layer [nm]. A concentration of the n-type dopant of the first region is $1.0 \times 10^{14}$ [cm$^{-3}$] or more and $1.0 \times 10^{19}$ [cm$^{-3}$] or less. The concentration of the n-type dopant of the (Continued)

first region and a concentration of hole of the first region satisfy 10≤ the concentration of the n-type dopant/the concentration of hole ≤$5.0 \times 10^{26}$.

20 Claims, 14 Drawing Sheets

(56) References Cited

U.S. PATENT DOCUMENTS

| | | | |
|---|---|---|---|
| 2020/0006589 A1 | 1/2020 | Yamamoto et al. | |
| 2020/0194608 A1* | 6/2020 | Yamamoto | H01L 31/0336 |
| 2021/0184064 A1* | 6/2021 | Yamamoto | H01L 31/0323 |
| 2021/0391491 A1 | 12/2021 | Honishi et al. | |
| 2022/0077332 A1* | 3/2022 | Yamamoto | H01L 31/0336 |

FOREIGN PATENT DOCUMENTS

| | | | |
|---|---|---|---|
| JP | 2017-157596 | 9/2017 | |
| JP | 2018-046196 | 3/2018 | |
| JP | 2020-202360 | 12/2020 | |
| JP | 2021-9957 | 1/2021 | |
| JP | 2021-22648 | 2/2021 | |
| JP | 2021-150603 | 9/2021 | |
| WO | 2020/059053 | 3/2020 | |
| WO | 2020/250521 | 12/2020 | |
| WO | 2021/002062 | 1/2021 | |
| WO | WO-2021002062 A1 * | 1/2021 | H01L 31/032 |
| WO | WO-2021019819 A1 * | 2/2021 | H01L 31/0323 |

OTHER PUBLICATIONS

Nakagawa, et al. "Development of a Zn-based n-layer in Cuprous Oxide Top Cells for High-efficiency Tandem Photovoltaics" Photovoltaic Specialists Conference (PVSC) 2020 47th IEEE.

Wang, et al. "Improving the p-type conductivity of Cu2O thin films by Ni doping and their heterojunction with n-ZnO" Applied Surface Science 590 (2022) 153047, pp. 1-12.

Minami, et al., "Relationship between the electrical properties of the n-oxide and p-Cu2O layers and the photovoltaic properties of Cu2O-based heterojunction solar cells", Solar Energy Materials & Solar Cells 147 (2016) 85-93.

* cited by examiner

FIG. 10

| | Thickness [nm] | Defect Level [eV] | Hole Concentration [cm⁻³] | Thickness of p-region [nm] | n-type Dopant Concentration [cm⁻³] | n-type Dopant Concentration / Hole Concentration | Comparison of Comparative Example |
|---|---|---|---|---|---|---|---|
| Comparative Example A-1 | 6000 | -0.17 | 1.0E+15 | 0 | 0 | — | — |
| Example A-1 | 6000 | -0.17 | 1.0E-05 | 6000 | 1.0E+15 | 1.0E+20 | Comparative Example A-1 |
| Example A-2 | 6000 | -0.17 | 1.0E-05 | 5000 | 1.0E+15 | 1.0E+20 | Comparative Example A-1 |
| Example A-3 | 6000 | -0.17 | 1.0E-05 | 4000 | 1.0E+15 | 1.0E+20 | Comparative Example A-1 |
| Example A-4 | 6000 | -0.17 | 1.0E-05 | 3000 | 1.0E+15 | 1.0E+20 | Comparative Example A-1 |
| Example A-5 | 6000 | -0.17 | 1.0E-05 | 2000 | 1.0E+15 | 1.0E+20 | Comparative Example A-1 |
| Example A-6 | 6000 | -0.17 | 1.0E-05 | 1500 | 1.0E+15 | 1.0E+20 | Comparative Example A-1 |
| Comparative Example A-2 | 6000 | -0.17 | 1.0E-05 | 1000 | 1.0E+15 | 1.0E+20 | Comparative Example A-1 |
| Comparative Example A-3 | 6000 | -0.17 | 1.0E-05 | 500 | 1.0E+15 | 1.0E+20 | Comparative Example A-1 |
| Comparative Example A-4 | 6000 | -0.17 | 1.0E-05 | 300 | 1.0E+15 | 1.0E+20 | Comparative Example A-1 |
| Comparative Example A-5 | 6000 | -0.17 | 1.0E-05 | 200 | 1.0E+15 | 1.0E+20 | Comparative Example A-1 |
| Comparative Example A-6 | 6000 | -0.17 | 1.0E-05 | 100 | 1.0E+15 | 1.0E+20 | Comparative Example A-1 |
| Comparative Example A-7 | 6000 | -0.17 | 1.0E-05 | 10 | 1.0E+15 | 1.0E+20 | Comparative Example A-1 |
| Comparative Example A-8 | 6000 | -0.17 | 1.0E-05 | 5 | 1.0E+15 | 1.0E+20 | Comparative Example A-1 |
| Comparative Example A-9 | 4000 | -0.17 | 1.0E-05 | 0 | 0 | — | — |
| Example A-7 | 4000 | -0.17 | 1.0E-05 | 3000 | 1.0E+15 | 1.0E+20 | Comparative Example A-9 |
| Example A-8 | 4000 | -0.17 | 1.0E-05 | 2000 | 1.0E+15 | 1.0E+20 | Comparative Example A-9 |
| Example A-9 | 4000 | -0.17 | 1.0E-05 | 1500 | 1.0E+15 | 1.0E+20 | Comparative Example A-9 |
| Comparative Example A-10 | 4000 | -0.17 | 1.0E-05 | 1000 | 1.0E+15 | 1.0E+20 | Comparative Example A-9 |
| Comparative Example A-11 | 4000 | -0.17 | 1.0E-05 | 500 | 1.0E+15 | 1.0E+20 | Comparative Example A-9 |
| Comparative Example A-12 | 4000 | -0.17 | 1.0E-05 | 300 | 1.0E+15 | 1.0E+20 | Comparative Example A-9 |
| Comparative Example A-13 | 4000 | -0.17 | 1.0E-05 | 200 | 1.0E+15 | 1.0E+20 | Comparative Example A-9 |
| Comparative Example A-14 | 4000 | -0.17 | 1.0E-05 | 10 | 1.0E+15 | 1.0E+20 | Comparative Example A-9 |
| Comparative Example A-15 | 4000 | -0.17 | 1.0E-05 | 5 | 1.0E+15 | 1.0E+20 | Comparative Example A-9 |

| | Open-Circuit Voltage [V] | Short-Circuit Current Density [mA/cm²] | Fill Factor | Conversion Efficiency [%] |
|---|---|---|---|---|
| Comparative Example A-1 | 1.131 | 10.579 | 0.701 | 8.394 |
| Example A-1 | 1.101 | 12.743 | 0.656 | 9.350 |
| Example A-2 | 1.116 | 12.593 | 0.684 | 9.618 |
| Example A-3 | 1.121 | 12.352 | 0.703 | 9.730 |
| Example A-4 | 1.125 | 12.024 | 0.718 | 9.711 |
| Example A-5 | 1.129 | 11.574 | 0.728 | 9.516 |
| Example A-6 | 1.131 | 11.293 | 0.731 | 9.328 |
| Comparative Example A-2 | 1.131 | 10.981 | 0.731 | 9.076 |
| Comparative Example A-3 | 1.131 | 10.681 | 0.726 | 8.771 |
| Comparative Example A-4 | 1.132 | 10.591 | 0.719 | 8.617 |
| Comparative Example A-5 | 1.132 | 10.559 | 0.714 | 8.527 |
| Comparative Example A-6 | 1.132 | 10.541 | 0.707 | 8.432 |
| Comparative Example A-7 | 1.131 | 10.565 | 0.701 | 8.380 |
| Comparative Example A-8 | 1.131 | 10.571 | 0.701 | 8.382 |
| Comparative Example A-9 | 1.131 | 10.509 | 0.701 | 8.329 |
| Example A-7 | 1.122 | 12.005 | 0.717 | 9.661 |
| Example A-8 | 1.128 | 11.556 | 0.728 | 9.487 |
| Example A-9 | 1.130 | 11.276 | 0.730 | 9.301 |
| Comparative Example A-10 | 1.131 | 10.963 | 0.730 | 9.053 |
| Comparative Example A-11 | 1.131 | 10.660 | 0.725 | 8.745 |
| Comparative Example A-12 | 1.131 | 10.568 | 0.718 | 8.588 |
| Comparative Example A-13 | 1.131 | 10.535 | 0.713 | 8.495 |
| Comparative Example A-14 | 1.131 | 10.534 | 0.700 | 8.341 |
| Comparative Example A-15 | 1.131 | 10.539 | 0.700 | 8.343 |

Fig. 11

| | Thickness [nm] | Defect Level [eV] | Hole Concentration [cm⁻³] | Electron Concentration [cm⁻³] | Thickness of p⁻ region [nm] | n-type Dopant Concentration [cm⁻³] | n-type Dopant Concentration / Hole Concentration | Comparison of Comparative Example |
|---|---|---|---|---|---|---|---|---|
| Comparative Example B-1 | 6000 | -0.17 | 1.0E+15 | 3.0E+13 | 0 | 0 | 0.00E+00 | |
| Comparative Example B-2 | 6000 | -0.17 | 5.0E+14 | 6.0E+13 | 4000 | 5.00E+14 | 1.00E+00 | Comparative Example B-1 |
| Comparative Example B-3 | 6000 | -0.17 | 4.0E+14 | 7.0E+13 | 4000 | 6.00E+14 | 1.50E+00 | Comparative Example B-1 |
| Comparative Example B-4 | 6000 | -0.17 | 3.0E+14 | 1.0E+12 | 4000 | 7.00E+14 | 2.33E+00 | Comparative Example B-1 |
| Comparative Example B-5 | 6000 | -0.17 | 2.0E+14 | 1.9E+12 | 4000 | 8.00E+14 | 4.00E+00 | Comparative Example B-1 |
| Example B-1 | 6000 | -0.17 | 9.0E+13 | 2.0E+12 | 4000 | 9.00E+14 | 1.00E+01 | Comparative Example B-1 |
| Example B-2 | 6000 | -0.17 | 2.0E-06 | 1.0E-04 | 4000 | 9.99E+14 | 4.99E+09 | Comparative Example B-1 |
| Example B-3 | 6000 | -0.17 | 3.0E-09 | 1.0E+02 | 4000 | 9.99E+14 | 3.33E+14 | Comparative Example B-1 |
| Example B-4 | 6000 | -0.17 | 1.0E-09 | 2.0E+07 | 4000 | 9.99E+14 | 9.99E+14 | Comparative Example B-1 |
| Example B-5 | 6000 | -0.17 | 5.0E-11 | 4.0E+12 | 4000 | 1.00E+15 | 2.00E+25 | Comparative Example B-1 |
| Comparative Example B-6 | 6000 | -0.17 | 8.0E-11 | 4.0E+12 | 4000 | 5.00E+15 | 6.25E+25 | Comparative Example B-1 |
| Comparative Example B-7 | 6000 | -0.17 | 1.0E-05 | 2.0E+07 | 100 | 1.00E+15 | 1.00E+20 | Comparative Example B-1 |
| Example B-6 | 6000 | -0.17 | 1.0E-05 | 2.0E+07 | 1500 | 1.00E+15 | 1.00E+20 | Comparative Example B-1 |
| Example B-7 | 6000 | -0.17 | 1.0E-05 | 2.0E+07 | 4000 | 1.00E+15 | 1.00E+20 | Comparative Example B-1 |
| Example B-8 | 6000 | -0.17 | 1.0E-05 | 2.0E+07 | 6000 | 1.00E+15 | 1.00E+20 | Comparative Example B-1 |
| Comparative Example B-8 | 6000 | -0.17 | 5.0E-11 | 8.0E+12 | 100 | 1.01E+15 | 2.02E+25 | Comparative Example B-1 |
| Example B-9 | 6000 | -0.17 | 5.0E-11 | 8.0E+12 | 300 | 1.01E+15 | 2.02E+25 | Comparative Example B-1 |
| Example B-10 | 6000 | -0.17 | 5.0E-11 | 8.0E+12 | 1500 | 1.01E+15 | 2.02E+25 | Comparative Example B-1 |
| Example B-11 | 6000 | -0.17 | 5.0E-11 | 8.0E+12 | 3000 | 1.01E+15 | 2.02E+25 | Comparative Example B-1 |
| Example B-12 | 6000 | -0.17 | 5.0E-11 | 8.0E+12 | 4000 | 1.01E+15 | 2.02E+25 | Comparative Example B-1 |
| Comparative Example B-9 | 6000 | -0.17 | 4.0E-12 | 7.0E+13 | 100 | 1.10E+15 | 2.75E+26 | Comparative Example B-1 |
| Comparative Example B-10 | 6000 | -0.17 | 4.0E-12 | 7.0E+13 | 300 | 1.10E+15 | 2.75E+26 | Comparative Example B-1 |
| Comparative Example B-11 | 6000 | -0.17 | 4.0E-12 | 7.0E+13 | 1500 | 1.10E+15 | 2.75E+26 | Comparative Example B-1 |
| Example B-13 | 6000 | -0.17 | 4.0E-12 | 7.0E+13 | 1500 | 1.10E+15 | 2.75E+26 | Comparative Example B-1 |
| Example B-14 | 6000 | -0.17 | 4.0E-12 | 7.0E+13 | 3000 | 1.10E+15 | 2.75E+26 | Comparative Example B-1 |
| Example B-15 | 6000 | -0.17 | 4.0E-12 | 7.0E+13 | 3000 | 1.10E+15 | 2.75E+26 | Comparative Example B-1 |
| Comparative Example B-12 | 6000 | -0.17 | 8.0E-13 | 4.0E+14 | 1500 | 1.50E+15 | 1.88E+27 | Comparative Example B-1 |
| Comparative Example B-13 | 6000 | -0.17 | 8.0E-13 | 4.0E+14 | 3000 | 1.50E+15 | 1.88E+27 | Comparative Example B-1 |

FIG. 12

| | Open-Circuit Voltage [V] | Short-Circuit Current Density [mA/cm²] | Fill Factor | Conversion Efficiency [%] |
|---|---|---|---|---|
| Comparative Example B-1 | 1.131 | 10.579 | 0.701 | 8.394 |
| Comparative Example B-2 | 1.128 | 10.996 | 0.681 | 8.443 |
| Comparative Example B-3 | 1.127 | 11.149 | 0.674 | 8.473 |
| Comparative Example B-4 | 1.127 | 11.355 | 0.667 | 8.534 |
| Comparative Example B-5 | 1.127 | 11.651 | 0.660 | 8.664 |
| Example B-1 | 1.126 | 12.086 | 0.663 | 9.019 |
| Example B-2 | 1.122 | 12.345 | 0.703 | 9.742 |
| Example B-3 | 1.122 | 12.351 | 0.703 | 9.735 |
| Example B-4 | 1.121 | 12.352 | 0.703 | 9.730 |
| Example B-5 | 1.121 | 12.357 | 0.698 | 9.667 |
| Comparative Example B-6 | 1.128 | 2.432 | 0.603 | 1.653 |
| Comparative Example B-7 | 1.131 | 10.981 | 0.731 | 9.076 |
| Example B-6 | 1.131 | 11.293 | 0.731 | 9.328 |
| Example B-7 | 1.121 | 12.352 | 0.703 | 9.730 |
| Example B-8 | 1.101 | 12.743 | 0.666 | 9.350 |
| Comparative Example B-8 | 1.131 | 10.984 | 0.732 | 9.088 |
| Example B-9 | 1.130 | 11.293 | 0.731 | 9.088 |
| Example B-10 | 1.129 | 11.579 | 0.730 | 9.545 |
| Example B-11 | 1.125 | 12.030 | 0.718 | 9.712 |
| Example B-12 | 1.121 | 12.357 | 0.698 | 9.667 |
| Comparative Example B-9 | 1.132 | 10.542 | 0.708 | 8.440 |
| Comparative Example B-10 | 1.132 | 10.694 | 0.729 | 8.817 |
| Comparative Example B-11 | 1.131 | 11.013 | 0.740 | 9.222 |
| Example B-13 | 1.129 | 11.338 | 0.742 | 9.499 |
| Example B-14 | 1.128 | 11.625 | 0.733 | 9.612 |
| Example B-15 | 1.124 | 12.049 | 0.693 | 9.388 |
| Comparative Example B-12 | 1.131 | 11.429 | 0.673 | 8.690 |
| Comparative Example B-13 | 1.128 | 10.732 | 0.621 | 7.519 |

Fig. 13

| | Thickness [nm] | Defect Level [eV] | Hole Concentration [cm⁻³] | Thickness of p⁻ region [nm] | n-type Dopant Concentration [cm⁻³] | n-type Dopant Concentration / Hole Concentration | Comparison of Comparative Example |
|---|---|---|---|---|---|---|---|
| Comparative Example C-1 | 6000 | -0.17 | 1.0E+12 | 0 | 0.0E+00 | 0.00E+00 | — |
| Comparative Example C-2 | 6000 | -0.17 | 1.0E-05 | 4000 | 1.0E+12 | 1.00E+17 | Comparative Example C-1 |
| Comparative Example C-3 | 6000 | -0.17 | 1.0E+13 | 0 | 0.0E+00 | 0.00E+00 | — |
| Comparative Example C-4 | 6000 | -0.17 | 1.0E-05 | 4000 | 1.0E+13 | 1.00E+18 | Comparative Example C-3 |
| Comparative Example C-5 | 6000 | -0.17 | 7.0E+12 | 4000 | 5.0E+13 | 7.14E+24 | Comparative Example C-3 |
| Comparative Example C-6 | 6000 | -0.17 | 1.0E+14 | 0 | 0.0E+00 | 0.00E+00 | — |
| Comparative Example C-7 | 6000 | -0.17 | 8.0E+13 | 4000 | 1.0E+13 | 1.25E-01 | Comparative Example C-6 |
| Comparative Example C-8 | 6000 | -0.17 | 4.0E+13 | 4000 | 5.0E+13 | 1.25E+00 | Comparative Example C-6 |
| Example C-1 | 6000 | -0.17 | 1.0E-05 | 4000 | 1.0E+14 | 1.00E+19 | Comparative Example C-6 |
| Comparative Example C-9 | 6000 | -0.17 | 7.0E+13 | 4000 | 5.0E+14 | 7.14E+20 | Comparative Example C-6 |
| Comparative Example C-10 | 6000 | -0.17 | 1.0E+16 | 0 | 0.0E+00 | 0.00E+00 | — |
| Comparative Example C-11 | 6000 | -0.17 | 9.0E+15 | 4000 | 1.0E+15 | 1.11E-01 | Comparative Example C-10 |
| Comparative Example C-12 | 6000 | -0.17 | 5.0E+15 | 4000 | 5.0E+15 | 1.00E+00 | Comparative Example C-10 |
| Example C-2 | 6000 | -0.17 | 1.0E-05 | 4000 | 1.0E+16 | 1.00E+21 | Comparative Example C-10 |
| Comparative Example C-13 | 6000 | -0.17 | 6.0E+14 | 4000 | 2.0E+15 | 3.33E+29 | Comparative Example C-10 |

FIG. 14

| | Open-Circuit Voltage [V] | Short-Circuit Current Density [mA/cm$^2$] | Fill Factor | Conversion Efficiency [%] |
|---|---|---|---|---|
| Comparative Example C-1 | 0.340 | 11.835 | 0.335 | 1.345 |
| Comparative Example C-2 | 0.338 | 11.827 | 0.336 | 1.340 |
| Comparative Example C-3 | 0.832 | 12.620 | 0.562 | 5.899 |
| Comparative Example C-4 | 0.813 | 12.658 | 0.567 | 5.836 |
| Comparative Example C-5 | 0.754 | 11.797 | 0.593 | 5.275 |
| Comparative Example C-6 | 1.118 | 11.840 | 0.645 | 8.546 |
| Comparative Example C-7 | 1.118 | 11.944 | 0.646 | 8.619 |
| Comparative Example C-8 | 1.115 | 12.283 | 0.653 | 8.935 |
| Example C-1 | 1.106 | 12.537 | 0.682 | 9.460 |
| Comparative Example C-9 | 1.060 | 6.100 | 0.660 | 4.265 |
| Comparative Example C-10 | 1.139 | 9.713 | 0.759 | 8.399 |
| Comparative Example C-11 | 1.139 | 9.770 | 0.757 | 8.421 |
| Comparative Example C-12 | 1.137 | 9.949 | 0.744 | 8.418 |
| Example C-2 | 1.126 | 12.326 | 0.706 | 9.799 |
| Comparative Example C-13 | 1.207 | 1.938 | 0.552 | 1.291 |

Fig. 15

| | Thickness [nm] | Defect Level [eV] | Hole Concentration [cm$^{-3}$] | Thickness of n-region [nm] | n-type Dopant Concentration [cm$^{-3}$] | n-type Dopant Concentration / Hole Concentration | Comparison of Comparative Example |
|---|---|---|---|---|---|---|---|
| Comparative Example C-14 | 6000 | -0.17 | 1.0E+17 | 0 | 0 | 0.00E+00 | — |
| Comparative Example C-15 | 6000 | -0.17 | 9.0E+16 | 4000 | 1.0E+16 | 1.11E-01 | Comparative Example C-14 |
| Comparative Example C-16 | 6000 | -0.17 | 5.0E+16 | 4000 | 5.0E+16 | 1.00E+00 | Comparative Example C-14 |
| Example C-3 | 6000 | -0.17 | 3.0E-05 | 4000 | 1.0E+17 | 3.33E+21 | Comparative Example C-14 |
| Comparative Example C-17 | 6000 | -0.17 | 4.0E-15 | 4000 | 5.0E+17 | 1.25E+32 | Comparative Example C-14 |
| Comparative Example C-18 | 6000 | -0.17 | 1.0E+18 | 0 | 0 | 0.00E+00 | — |
| Comparative Example C-19 | 6000 | -0.17 | 9.0E+17 | 4000 | 1.0E+17 | 1.11E-01 | Comparative Example C-18 |
| Comparative Example C-20 | 6000 | -0.17 | 5.0E+17 | 4000 | 5.0E+17 | 1.00E+00 | Comparative Example C-18 |
| Example C-4 | 6000 | -0.17 | 7.0E-05 | 4000 | 1.0E+18 | 1.43E+22 | Comparative Example C-18 |
| Comparative Example C-21 | 6000 | -0.17 | 2.0E-15 | 4000 | 5.0E+18 | 2.50E+33 | Comparative Example C-18 |
| Comparative Example C-22 | 6000 | -0.17 | 1.0E+19 | 0 | 0 | 0.00E+00 | — |
| Comparative Example C-23 | 6000 | -0.17 | 9.0E+18 | 4000 | 1.0E+18 | 1.11E-01 | Comparative Example C-22 |
| Comparative Example C-24 | 6000 | -0.17 | 5.0E+18 | 4000 | 5.0E+18 | 1.00E+00 | Comparative Example C-22 |
| Comparative Example C-25 | 6000 | -0.17 | 1.0E-04 | 4000 | 1.0E+19 | 1.00E+23 | Comparative Example C-22 |
| Example C-5 | 6000 | -0.17 | 3.0E-10 | 4000 | 1.001E+19 | 3.34E+28 | Comparative Example C-22 |
| Comparative Example C-26 | 6000 | -0.17 | 1.0E+20 | 0 | 0 | 0.00E+00 | — |
| Comparative Example C-27 | 6000 | -0.17 | 7.0E-04 | 4000 | 1.0E+20 | 1.43E+23 | Comparative Example C-26 |

FIG. 16

| | Open-Circuit Voltage [V] | Short-Circuit Current Density [mA/cm²] | Fill Factor | Conversion Efficiency [%] |
|---|---|---|---|---|
| Comparative Example C-14 | 1.141 | 9.311 | 0.776 | 8.245 |
| Comparative Example C-15 | 1.140 | 9.299 | 0.775 | 8.212 |
| Comparative Example C-16 | 1.139 | 9.364 | 0.766 | 8.177 |
| Example C-3 | 1.133 | 10.674 | 0.755 | 9.129 |
| Comparative Example C-17 | 1.456 | 2.502 | 0.601 | 2.189 |
| Comparative Example C-18 | 1.144 | 9.120 | 0.729 | 7.606 |
| Comparative Example C-19 | 1.139 | 8.204 | 0.715 | 6.677 |
| Comparative Example C-20 | 1.131 | 7.001 | 0.694 | 5.494 |
| Example C-4 | 1.115 | 10.652 | 0.712 | 8.461 |
| Comparative Example C-21 | 1.476 | 1.855 | 0.528 | 1.446 |
| Comparative Example C-22 | 1.166 | 8.687 | 0.609 | 6.166 |
| Comparative Example C-23 | 1.146 | 5.528 | 0.534 | 3.385 |
| Comparative Example C-24 | 1.124 | 4.553 | 0.473 | 2.418 |
| Example C-5 | 1.092 | 12.158 | 0.503 | 6.681 |
| Comparative Example C-25 | 1.058 | 3.514 | 0.644 | 2.395 |
| Comparative Example C-26 | 1.217 | 7.897 | 0.605 | 5.812 |
| Comparative Example C-27 | 1.064 | 10.270 | 0.542 | 5.923 |

Fig. 17

| | Thickness [nm] | Defect Level [eV] | Hole Concentration [cm⁻³] | Thickness of Second region [nm] | Hole Concentration of Second region [nm] | Comparison of Comparative Example |
|---|---|---|---|---|---|---|
| Comparative Example D-1 | 6000 | -0.17 | 1.0E-05 | 0 | - | --- |
| Example D-1 | 6000 | -0.17 | 1.0E-05 | 100 | 1.0E+17 | Comparative Example D-1 |
| Example D-2 | 6000 | -0.17 | 1.0E-05 | 100 | 1.0E+18 | Comparative Example D-1 |
| Example D-3 | 6000 | -0.17 | 1.0E-05 | 100 | 1.0E+19 | Comparative Example D-1 |
| Example D-4 | 6000 | -0.17 | 1.0E-05 | 100 | 1.0E+20 | Comparative Example D-1 |

Fig. 18

|  | Open-Circuit Voltage [V] | Short-Circuit Current Density [mA/cm²] | Fill Factor | Conversion Efficiency [%] |
|---|---|---|---|---|
| Comparative Example D-1 | 1.126 | 12.326 | 0.706 | 9.799 |
| Example D-1 | 1.126 | 12.405 | 0.706 | 9.859 |
| Example D-2 | 1.127 | 12.502 | 0.705 | 9.933 |
| Example D-3 | 1.127 | 12.524 | 0.705 | 9.950 |
| Example D-4 | 1.127 | 12.526 | 0.705 | 9.952 |

SOLAR CELL, MULTI-JUNCTION SOLAR CELL SOLAR CELL MODULE, AND PHOTOVOLTAIC POWER GENERATION SYSTEM

CROSS-REFERENCE TO RELATED APPLICATION

This application is a Continuation application based upon and claims the benefit of priority from International Patent Application No. PCT/JP2022/13553, the International Filing Date of which is Mar. 23, 2022, the entire contents of which are incorporated herein by reference.

FIELD

Embodiments described herein relate generally to a solar cell, a multi-junction solar cell, a solar cell module, and a photovoltaic power generation system.

BACKGROUND

One of new solar cells is a solar cell using a cuprous oxide ($Cu_2O$) for a light-absorbing layer. $Cu_2O$ is a wide-gap semiconductor. Since $Cu_2O$ is a safe and inexpensive material including copper and oxygen abundantly present on the earth, it is expected that a high-efficiency and low-cost solar cell can be realized.

BRIEF DESCRIPTION OF THE DRAWINGS

FIG. 10 is a table related to Examples.
FIG. 11 is a table related to Examples.
FIG. 12 is a table related to Examples.
FIG. 13 is a table related to Examples.
FIG. 14 is a table related to Examples.
FIG. 15 is a table related to Examples.
FIG. 16 is a table related to Examples.
FIG. 17 is a table related to Examples.
FIG. 18 is a table related to Examples.
FIG. 19 is a table related to Examples.

DETAILED DESCRIPTION

A solar cell according to an embodiment includes a p-electrode, an n-electrode, a p-type light-absorbing layer on the p-electrode, and an n-type layer between the p-type light-absorbing layer and the n-electrode. A first region is included in the p-type light-absorbing layer from a surface on the n-type layer side toward the p-electrode. The first region includes n-type dopant. A thickness of the first region is 1500 [nm] or more and a thickness of the p-type light-absorbing layer [nm] or less. A concentration of the n-type dopant of the first region is $1.0\times10^{14}$ [$cm^{-3}$] or more and $1.0\times10^{19}$ [$cm^{-3}$] or less. The concentration of the n-type dopant of the first region and a concentration of hole of the first region satisfy 10≤ the concentration of the n-type dopant/the concentration of hole ≤$5.0\times10^{26}$.

Hereinafter, an embodiment will be described in detail with reference to the drawings. Unless otherwise specified, values at 25 [degrees Celsius] and 1 atm (atmosphere) are illustrated. An average represents an arithmetic mean value. Each concentration represents an average concentration of region or layer of the subject. In each layer, including a specific element means that the specific element is detected by SIMS (Secondary Ion Mass Spectrometry). In each layer, not-including a specific element means that the specific element is not detected by SIMS (Secondary Ion Mass Spectrometry).

In the specification, "/" (slash) represents the division sign excluding "/" of "and/or". In the specification, "·" (middle dot, dot operator) represents a multiplication sign. In the specification, "." (period) of a numerical value represents a decimal point.

First Embodiment

Figure 1:
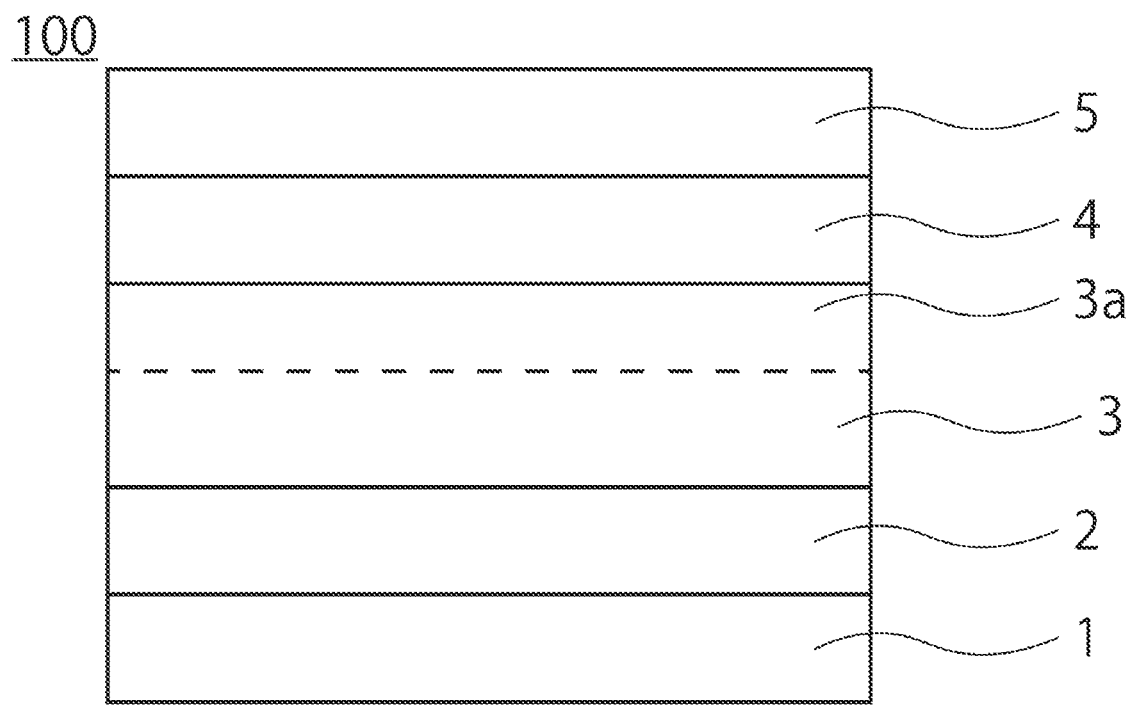
FIG. 1 is a schematic cross-sectional diagram of a solar cell according to an embodiment.

A first embodiment relates to a solar cell. A cross-sectional diagram of the solar cell according to the first embodiment is illustrated in FIG. 1. As illustrated in FIG. 1, the solar cell 100 according to present embodiment includes a substrate 1, a p-electrode 2 as a first electrode, a p-type light-absorbing layer 3, an n-type layer 4, and an n-electrode 5 as a second electrode. An intermediate layer which is not illustrated may be included between, for example, the n-type layer 4 and the n-electrode 5. Sunlight may be incident from either the n-electrode 5 side or the p-electrode 2 side but is more preferably incident from the n-electrode 5 side. Since the solar cell 100 according to the embodiment is a transparent solar cell, it is preferable that the solar cell 100 is used as a top cell (light incident side) of a multi-junction solar cell. In FIG. 1, the substrate 1 is provided on a side of the p-electrode 2 opposite to the p-type light-absorbing layer 3 side. In the solar cell 100 of the embodiment, light is incident from the n-electrode 5 side toward the p-electrode 2 side. Hereinafter, although a mode illustrated in FIG. 1 will be described, a mode in which the substrate 1 is provided on the n-electrode 5 side except that a position of the substrate 1 is different is also used. In the solar cell 100 of the embodiment, light is incident from the n-electrode 5 side toward the p-electrode 2 side.

The substrate 1 is a transparent substrate. A transparent organic substrates such as acrylic, polyimide, polycarbonate, polyethylene terephthalate (PET), polypropylene (PP), fluorine-based resins (polytetrafluoroethylene (PTFE), perfluoroethylene propene copolymer (FEP), ethylene tetrafluoroethylene copolymer (ETFE), polychlorotrifluoroethylene (PCTFE), perfluoroalkoxy alkane (PFA), and the like), polyarylate, polysulfone, polyethersulfone, and polyetherimide, and inorganic substrates such as soda lime glass, white glass, chemically strengthened glass, and quartz can be used as the substrate 1. As the substrate 1, the substrates listed above can be stacked.

The p-electrode 2 is provided on the substrate 1 and is disposed between the substrate 1 and the p-type light-absorbing layer 3. The p-electrode and the p-type light-absorbing layer 3 preferably form ohmic contact. The p-electrode 2 is a conductive layer having transparency provided on the p-type light-absorbing layer 3 side. A thickness of the p-electrode 2 is typically 100 nm or more and 2000 nm or less. In FIG. 1, the p-electrode 2 is in direct contact with the light-absorbing layer 3. It is preferable that the p-electrode 2 includes one or more layers of transparent conductive oxide films. The transparent conductive oxide film is not particularly limited, and is an indium tin oxide (ITO), an Al-doped zinc oxide (AZO), a boron-doped zinc oxide (BZO), a gallium-doped zinc Oxide (GZO), a doped tin oxide, a titanium-doped indium oxide (ITiO), an indium zinc oxide (IZO), an indium gallium zinc oxide (IGZO), a hydrogen-doped indium oxide (IOH), or the like. The transparent conductive oxide film may be a stacked film having a plurality of films. A dopant for a film of tin oxide or the like is not particularly limited as long as the dopant is one or more elements selected from the group consisting of In, Si, Ge, Ti, Cu, Sb, Nb, Ta, W, Mo, F, Cl, and the like. In the doped tin oxide film, one or more elements selected from the group consisting of In, Si, Ge, Ti, Cu, Sb, Nb, Ta, W, Mo, F, Cl, and the like are preferably contained at 10 atom % or less with respect to tin contained in the tin oxide film. The metal film preferably has a thickness of 1 [nm] or more and 2 [µm] or less, and metal (including alloy) contained in the metal film is not limited to Mo, Au, Cu, Ag, Al, Ta, and W. It is preferable that the p-electrode 2 includes a dot-shaped, line-shaped, or mesh-shaped electrode (one or more selected from the group consisting of metal, an alloy, graphene, a conductive nitride, and a conductive oxide) between the transparent conductive oxide film and the substrate 1 or between the transparent conductive oxide film and the p-type light-absorbing layer 3. It is preferable that the dot-shaped, line-shaped, or mesh-shaped metal has an aperture ratio of 50% or more with respect to the transparent conductive oxide film. The dot-like, line-like, or mesh-like metal is not particularly limited, and is Mo, Au, Cu, Ag, Al, Ta, W, or the like. When the metal film is used for the p-electrode 2, it is preferable that a film thickness is about 5 [nm] or less from the viewpoint of transparency. When the line-shaped or mesh-shaped metal film is used, since the transparency is secured at an opening, the film thickness of the metal film is not limited thereto.

The doped tin oxide film that forms ohmic contact with the p-type light-absorbing layer 3 is preferably provided on the most outer surface of the transparent conductive oxide film on the p-type light-absorbing layer 3 side. At least part of the doped tin oxide film that forms ohmic contact with the p-type light-absorbing layer 3 provided on the most outer surface of the transparent conductive oxide film on the p-type light-absorbing layer 3 side is preferably in direct contact with the p-type light-absorbing layer 3.

The p-type light-absorbing layer 3 is a p-type semiconductor layer. The p-type light-absorbing layer 3 may be in direct contact with the p-electrode 2, or other layers may be present as long as the contact with the p-electrode 2 can be secured. The p-type light-absorbing layer 3 is provided between the p-electrode 2 and the n-type layer 4. The p-type light-absorbing layer 3 is in direct contact with the n-type layer 4. The p-type light-absorbing layer 3 includes a first region 3a. It is preferable that the p-type light-absorbing layer 3 is a compound semiconductor. It is preferable that the p-type light-absorbing layer 3 in non-doped state is a p-type compound semiconductor. The p-type light-absorbing layer 3 in non-doped state is a semiconductor layer including a compound selected from the group consisting of cuprous oxide (a cuprous oxide compound), a compound having a chalcopyrite structure, a compound having a kesterite structure, a compound having a stannite structure, and perovskite structure.

When the p-type light-absorbing layer 3 includes the cuprous oxide, it is preferable that the p-type light-absorbing layer 3 is a cuprous oxide compound including cuprous oxide as a main component. In other words, it is preferable that the p-type light-absorbing layer 3 is a semiconductor layer including the cuprous oxide compound. The p-type light-absorbing layer 3 is polycrystal of the cuprous oxide compound. The cuprous oxide compound may include one or more impurities selected from the group of copper (Cu), cupric oxide (CuO), and hydroxide copper ($Cu(OH)_2$). In the simulation, the impurities not considered, the effect of the first region 3a which includes the small amount of the impurity (a weight ratio of impurity to the p-type light-absorbing layer 3 is 0.1% or less) is obtained as in absence of the impurity.

An atomic amount of Cu is regarded as 1, and an atomic amount of oxygen is preferably 0.48 or more and 0.56 or less. When there is more oxygen relative to copper, a bandgap becomes narrow due to high ratio of the cupric oxide contained in the cuprous oxide compound, and it is not preferable that a transmittance of the p-type light-absorbing layer is decreased. When there is less oxygen relative to copper, it is not preferable that a transmittance of the p-type light-absorbing layer is decreased since the amount of Cu contained in the cuprous oxide compound becomes large.

The cuprous oxide compound is an oxide including cuprous oxide as a main component. When the amount ratio of all metal elements contained in the p-type light-absorbing layer 3 is expressed as 100[%], the amount of copper element contained in the p-type light-absorbing layer is preferably 95 [%] or more and 100[%] or less, more preferably 98[%] or more and 100[%] or less, and still more preferably 99[%] or more and 100[%] or less.

The cuprous oxide compound includes copper, oxygen, and an element represented by M1 and optionally includes an element represented by M3, or includes copper, oxygen, and an element represented by M1 or/and an element represented by M2 and optionally includes an element represented by M3. It is preferable that the element represented by M1 is one or more halogen elements selected from the group consisting of Cl, F, Br, and I. It is preferable that the element represented by M2 is one or more metal elements selected from the group consisting of Mn, Tc, and Re. It is preferable that the element represented by M3 is one or more elements selected from the group consisting of Sn, Sb, Ag, Li, Na, K, Cs, Rb, Al, In, Zn, Mg, Ga, Si, Ge, N, P, B, Ti, Hf, Zr, and Ca. The cuprous oxide or a complex oxide of cuprous oxide of the p-type light-absorbing layer 3 is doped with the element represented by M1 which is an n-type dopant or/and the element represented by M2 which is an n-type dopant. In a simulation of condition where the element represented by M3 is not included, the conditions of the first region 3a or the like is calculated, and the effect of the first region 3a which is included in the p-type light-absorbing layer 3 including, specifically, the complex oxide of cuprous oxide doped with the n-type dopant obtained as in present of the element represented by M3 which is included in the p-type light-absorbing layer 3.

95 [wt %] or more and 100 [wt %] or less of the p-type light-absorbing layer 3 is preferably the cuprous oxide compound, 98 [wt %] or more and 100 [wt %] or less of the p-type light-absorbing layer 3 is more preferably the cuprous oxide compound, and 99 [wt %] or more and 100 [wt %] or less of the p-type light-absorbing layer 3 is still more preferably the cuprous oxide compound. 100 [wt %] of the p-type light-absorbing layer 3 may consist of the cuprous oxide compound.

It is preferable that the transmittance of the p-type light-absorbing layer 3 becomes higher when heterogenous phase contained in the p-type light-absorbing layer 3 is small and the p-type light-absorbing layer 3 has excellent crystallinity. When the element represented by M3 is included in the p-type light-absorbing layer 3, the bandgap of the p-type light-absorbing layer 3 can be adjusted. It is preferable that the bandgap of the p-type light-absorbing layer 3 is 2.0 [eV] or more and 2.2 [eV] or less. when the range of the bandgap is satisfied, both a top cell and bottom cell of a multi-junction solar cell using the solar cell according to the embodiment for the top cell uses sun-light effectively. It is preferable that the p-type light-absorbing layer 3 includes Sn or/and Sb. Sn or/and Sb may be added to the p-type light-absorbing layer 3 or may be come from the p-electrode 2. Ga included in the p-type light absorbing layer 3 is not included raw material for forming the p-type light-absorbing layer 3 and is dispersed from the n-type layer 4 to the p-type light-absorbing layer 3. When the other elements are used for forming the n-type layer 4, these elements may be also dispersed to the p-type light-absorbing layer 3.

The above composition ratio of the p-type light-absorbing layer 3 is an overall composition ratio of the p-type light-absorbing layer 3. Additionally, above composition ratio of compounds of the p-type light-absorbing layer 3 is preferably satisfied in the p-type light-absorbing layer 3 entirely.

When the compound of the p-type light absorbing layer 3 is different from the compound of the n-type layer 4 and forms pn-heterojunction, one or more elements of the n-type layer 4 are dispersed to the p-type light-absorbing layer, one or more elements of the p-type light-absorbing layer 3 is dispersed to the n-type layer 4, a mixed region between the p-type light-absorbing layer 3 and the n-type layer 4 where the elements are dispersed each other whose thickness is 20 [nm] or less may exist. 90 [atom %] or less of the metal elements included in the mixed region is the metal elements included in the p-type light-absorbing layer 3 and 10 [atom %] or more of the metal elements included in the mixed region is the metal elements included in the n-type layer 4. When the mixed region exists, a surface of the p-type light-absorbing layer 3 on the n-type layer 4 side is a surface of the p-type light-absorbing layer 3 excluding the mixed region on the n-type layer 4 and a surface of the n-type layer 4 on the p-type light-absorbing layer 3 side is a surface of the n-type layer 4 excluding the mixed region on the p-type light-absorbing layer 3.

A thickness of the p-type light-absorbing layer 3 is evaluated by observing a cross-section of electron microscope or step profiler, is preferable 2000 [nm] or more and 15000 [nm] or less (2 [μm] or more and 15 [μm] or less), more preferably 2500 [nm] or more and 10000 [nm] or less, still more preferably 4000 [nm] or more and 10000 [nm] or less, and preferably 4000 [nm] or more and 8000 [nm] or less. The difference in elevation of unevenness of the p-type light-absorbing layer 3 is small, and the difference between the minimum thickness of the p-type light-absorbing layer 3 and the maximum thickness of the p-type light-absorbing layer 3 is preferably 0 [nm] or more and 100 [nm] or less, and more preferably 0 [nm] or more and 50 [nm] or less. The p-type light-absorbing layer 3 has a rectangular shape.

SCAPS (SCAPS-1D for thin film solar cells developed at ELIS, University of Gent) is used as a simulation software, a simulation that Poisson equation and continuity equation is dissolved is performed, it was found that the short circuit current density is increased, and the conversion efficiency is improved when the first region 3a is p− (p minus) type, i (intrinsic) type, or n− (n minus) type exists in the p-type light-absorbing layer 3 on the n-type layer 4 side and the first region 3a junctions with the n-type layer 4.

The first region 3a is a region that the n-type dopant is included in the p-type light-absorbing layer 3. The first region 3a exists from a surface of the p-type light-absorbing layer 3 on the n-type layer 4 side toward the p-electrode 2. The element represented by M1 and the element represented by M2 are the n-type dopant for cuprous oxide, and the first region 3a includes the element represented by M1 or the element represented by M1 or/and the element represented by M2. The first region 3a is n-type, i type, or n-type and includes dopant, and the first region 3a is a n− (n minus) type which is not completely n-typed such as an electron concentration is $10^{15}$ [cm$^{-3}$] or more. Cl is preferably included as the n-type dopant included in the first region 3a. It is preferable that the n-type dopant included in the first region 3a is Cl.

The n-type dopant of the first region 3a may be inclined so that the concentration on the n-type layer 4 side is high and the concentration on the p-electrode 2 side is low. When the dopant is inclined, the first region 3a includes 2 or 3 conductive types selected from n− (n minus) type, i (intrinsic) type, and p− (p minus) type.

When the thickness of the first region 3a is 10 [nm] or more and 100 [nm] or less, improving of the conversion efficiency is not confirmed. When the first region 3a whose thickness is much thicker than above thickness, the short-circuit current density is conspicuously improved and the conversion efficiency is improved. The thick first region 3a contributes improving of the conversion efficiency since FF (Fill Factor) remains the same or increase when the thick first region 3a is provided. The thickness of the first region 3a is preferably 1500 [nm] or more and equal to the thickness of the p-type light-absorbing layer 3 or less, and more preferably 2000 [nm] or more and equal to the thickness of the p-type light-absorbing layer 3 or less. It was revealed that the short-circuit current density and the conversion efficiency of the configuration that the p-type light-absorbing layer 3 is entirely the first region 3a and partly the first region 3a are improved comparing that of the configuration that the first region 3a does not exist by the simulation.

It is preferable that the first region 3a is one continuous region. When the first region 3a is separated into two regions in the p-type light-absorbing layer 3, the short-circuit current density is decreased because the depletion layer width is diminished. When the p-type light-absorbing layer 3 which is not the first region exists between the first region 3a and the n-type layer 4, the short-circuit current density is decreased because the depletion layer width is diminished. Therefore, it is preferable that the first region 3a is the one continuous region which exists from the surface of the p-type light-absorbing layer 3 on the n-type layer 4 side toward the p-electrode 2.

When the first region 3a and a region other than the first region 3a exist on the surface of the p-type light-absorbing layer 3 on the n-type layer 4 side, the n-type layer 4 includes a portion which junctions the first region 3a and a portion which junctions the region other than the first region 3a, the short-circuit current density is decreased since the depletion layer width is diminished. Therefore, it is preferable that the first region 3a exists on the entire surface of the p-type light-absorbing layer 3 on the n-type layer 4 side.

If the first region 3a is a narrow region, proving the first region 3a has little effect of increasing the short-circuit current density. The short-circuit current density is increased when the thickness of the first region 3a is enough.

When the thickness of the p-type light-absorbing layer 3 is 2000 [nm] or more and less than 4000 [nm], in view of increasing the short-circuit current density, the thickness of the first region 3a is preferably 1500 [nm] or more and the thickness of the p-type light absorbing layer 3 or less. In view of improving the conversion efficiency, the thickness of the p-type light-absorbing layer 3 is 4000 [nm] or more and 10000 [nm] or less. When the thickness of the p-type light-absorbing layer 3 is 4000 [nm] or more, the thickness of the p-type light-absorbing layer 3 is denoted by t [nm], the thickness of the first region 3a is preferably ((t−4000)/2)+ 1500 [nm] or more and t [nm] or less, more preferably. ((t−2000)/2)+1000 [nm] or more and t [nm] or less, and still more preferably ((t−2000)/2)+2000 [nm] or more and t [nm] or less.

When the thickness of the p-type light-absorbing layer 3 is 2000 [nm] or more and less than 4000 [nm], in view of increasing the short-circuit current density, the thickness of the first region 3a is preferably 1500 [nm] or more and less than t [nm], and more preferably 1500 [nm] or more and 0.9t [nm] or less. When the thickness of the p-type light-absorbing layer 3 is 4000 [nm] or more, the thickness of the first region 3a is ((t−4000)/2)+1500 [nm] or more and less than t [nm], more preferably ((t−2000)/2)+1000 [nm] or more and less than t [nm], and still more preferably ((t−2000)/2)+2000 [nm] or more and less than t [nm]. When the thickness of the p-type light-absorbing layer 3 is 4000 [nm] or more, the thickness of the first region 3a is ((t−4000)/ 2)+1500 [nm] or more and t [nm] or less, more preferably ((t−2000)/2)+1000 [nm] or more and t [nm] or less, and still more preferably ((t−2000)/2)+2000 [nm] or more and t [nm] or less. When the thickness of the p-type light-absorbing layer 3 is 4000 [nm] or more, the thickness of the first region 3a is preferably ((t−4000)/2)+1500 [nm] or more and 0.9t [nm] or less, more preferably ((t−2000)/2)+1000 [nm] or more and 0.9t [nm] or less, still more preferably ((t−2000)/ 2)+2000 [nm] or more and 0.9t [nm] or less.

When the thickness of the first layer is 2000 [nm] or more, the increasing effect of the short-circuit current density becomes conspicuous. Therefore, it is preferable that the thickness of the p-type light-absorbing layer 3 is 2000 [nm] or more and 15000 [nm] or less and the thickness of the first region 3a is 2000 [nm] or more and t [nm] or less. When part of the p-type light-absorbing layer 3 is not the first region 3a, the thickness of the first region is preferably 2000 [nm] or more and t [nm] or less, and more preferably 2000 [nm] or more and 0.9t [nm] or less. When the thickness of the first region 3a is 2000 nm, the thickness of the p-type light-absorbing layer 3 is preferably 4000 nm or more and 10000 nm or less, more preferably 4000 nm or more and 8000 nm or less, and still more preferably 4000 nm or more and 6000 nm or less.

In view of increasing the short-circuit current density, the thickness of the p-type light-absorbing layer 3 is preferably 2000 [nm] or more and 15000 [nm] or less, more preferably 4000 [nm] or more and 10000 [nm] or less, more preferably 4000 [nm] or more and 8000 [nm] or less, still more preferably 4000 [nm] or more and 6000 [nm] or less, and the thickness of the first region 3a is 2000 [nm] or more and (("thickness of the p-type light-absorbing layer 3" [nm])− ("thickness of the p-type light-absorbing layer 3" [nm]− 2000 [nm])/4) [nm] or less.

The difference between the minimum thickness of the first region 3a and the maximum thickness of the first region 3a is preferably 0 [nm] or more and 500 [nm] or less and more preferably 0 [nm] or more and 300 [nm] or less. It is preferable that the difference of the depletion layer width in the p-type light absorbing layer 3 is small when the difference of the thickness of the first region is small.

In the first region 3a, a total concentration [cm$^{-3}$](concentration of the n-type dopant) of the one or more halogen elements selected from the group consisting of Cl, F, Br, and I is preferably $1.0\times10^{14}$ [cm$^{-3}$] or more and $1.0\times10^{9}$ [cm$^{-3}$] or less and $1.0\times10^{1}\leq$ {concentration of the n-type dopant [cm$^{-3}$]}/{concentration of the hole [cm$^{-3}$]}$\leq5.0\times10^{26}$ is preferably satisfied. When the element represented by M2 is included in the first region 3a, the concentration of the n-type dopant is a total concentration of one or more elements selected from the group consisting of Mn, Tc, and Re or a total concentration of one or more elements selected from the group consisting of Cl, F, Br, I, Mn, Tc, and Re. When the above range of {concentration of n-type dopant [cm$^{-3}$]}/{concentration of hole [cm$^{-3}$]} is satisfied, the short-circuit current density is improved, and a solar cell 100 having high conversion efficiency can be obtained since the open circuit voltage and the fill factor is middle.

A hole concentration of an original material (a hole concentration where the n-type dopant is not included) of the p-type light absorbing layer 3 that increasing of the short-circuit current density due to the n-type dopant is confirmed is preferably $1.0\times10^{14}$ [cm$^{-3}$] or more and $1.0\times10^{19}$ [cm$^{-3}$] or less. When the above concentration of the n-type dopant is satisfied and the concentration of hole is high or low, the short-circuit current density is not increased or decreased by providing the first region 3a. The preferable range of the concentration of hole varies depending on the concentration of hole of the original material. Accordingly, conditions that the short-circuit current density is increased was revealed based on a relationship of the concentration of the n-type dopant of the first region 3a and the concentration of the hole of first region 3a obtained by inventor's simulations. It is preferable that $1.0\times10^{1}\leq$ {concentration of the n-type dopant [cm$^{-3}$]}/{concentration of hole [cm$^{-3}$]}$\leq5.0\times10^{26}$ is satisfied in the first region 3a.

When the thickness of the first region 3a is less than 1500 nm, the short-circuit current density may be conspicuously increased. When the thickness of the first region 3a is less than 1500 nm, in many cases the short-circuit current density is seldom increased depending on the concentration of the n-type dopant and the concentration of hole of the original material (a concentration of hole where the n-type dopant is not included). When the thickness of the first region 3a is 1500 nm or more and $1.0\times10^{1}\leq$ {concentration of the n-type dopant [cm$^{-3}$]}/{concentration of hole [cm$^{-3}$]}$\leq5.0\times10^{26}$ is satisfied, the short-circuit current density is increased in all simulation results.

It is preferable that the concentration [cm$^{-3}$] of the n-type dopant of the first region 3a is $1.0\times10^{14}$ [cm$^{-3}$] or more and $1.0\times10^{19}$ [cm$^{-3}$] or less and the concentration of hole of the first region 3a is $4.0\times10^{-12}$ [cm$^{-3}$] or more and $9.0\times10^{13}$ [cm$^{-3}$] or less. It is more preferable that the concentration [cm$^{-3}$] of the n-type dopant of the first region 3a is $9.0\times10^{14}$ [cm$^{-3}$] or more and $1.0\times10^{17}$ [cm$^{-3}$] or less and the concentration of hole of the first region 3a is $5.0\times10^{-11}$ [cm$^{-3}$] or more and $2.0\times10^{6}$ [cm$^{-3}$] or less.

The difference between the minimum value of the concentration of the n-type dopant and the maximum value of the concentration of the n-type dopant is preferably 1 times or more and 1000 times or less, more preferably 1 times or more and 100 times or less, and still more preferably 1 times or more and 50 times or less. However, the concentration of the n-type dopant is inclined to be higher on the n-type layer 4 side and to be lower on the p-electrode 2 side, the difference between the minimum value of the concentration of the n-type dopant and the maximum value of the concentration of the n-type dopant may be larger than the above range.

Entirely of the p-type light-absorbing layer 3 may be the first region 3a, but it is preferable that the p-type light-absorbing layer 3 on the p-electrode 2 side is not the first region 3a. The concentration of hole in a region of the p-type light absorbing layer 3 which is not the first region 3a is preferably 1 times or more and 10,000 times or more of the concentration of hole of the first region 3a, more preferably 5 times or more and 100000 time or less of the concentration of the first region 3a, and still more preferably 10 times or more and 100000 times or less of the concentration of hole of the first region 3a. The concentration of hole in a region of the p-type light absorbing layer 3 which is not the first region 3a is preferably $1.0 \times 10^{14}$ [cm$^{-3}$] or more and $1.0 \times 10^{19}$ [cm$^{-3}$] or less, and more preferably $1.0 \times 10^{15}$ [cm$^{-3}$] or more and $1.0 \times 10^{18}$ [cm$^{-3}$] or less. The concentration of the n-type dopant is not $1.0 \times 10^{14}$ [cm$^{-3}$] or more and $1.0 \times 10^{19}$ [cm$^{-3}$] or less and $1.0 \times 10^{1} \le$ {concentration of the n-type dopant [cm$^{-3}$]}/{concentration of hole [cm$^{-3}$]}$\le 5.0 \times 10^{26}$ is not satisfied, in a region of the p-type light absorbing layer 3 which is not the first region 3a.

Si, Ge, N, and P of the M3 of the cuprous oxide compound are a p-type dopant for the cuprous oxide. When one or more elements selected from the group consisting of Si, Ge, N, and P are included in the p-type light-absorbing layer 3, the first region 3a may include the p-type dopant for the p-type light-absorbing layer 3. The total concentration [cm$^{-3}$] of Si, Ge, N, and P in the first region is preferably 30[%] or less of the concentration [cm$^{-3}$] of the n-type dopant, more preferably 10[%] or less of the concentration [cm$^{-3}$] of the n-type dopant, still more preferably 1[%] or less of the concentration [cm$^{-3}$] of the n-type dopant. When the p-type dopant is included in the first region 3a, the concentration [cm$^{-3}$] of the n-type dopant is subtracted the total concentration [cm$^{-3}$] of Si, Ge, N, and P, from the total concentration [cm$^{-3}$] of the halogen element selected from the group consisting of Cl, F, Br, and I, the total concentration [cm$^{-3}$] of the element selected from the group consisting of Mn, Tc, and Re, or the total concentration [cm$^{-3}$] of the element selected from the group consisting of Cl, F, Br, I, Mn, Tc, and Re.

In the p-type light-absorbing layer 3, the first region 3a exists from the surface of the p-type light-absorbing layer 3 on the n-type layer 4 side toward the p-electrode 2 side of the p-type light-absorbing layer 3. Both a solar cell 100 that entirely of the p-type light-absorbing layer 3 is the first region 3a and a solar cell 100 that part of the p-type light-absorbing layer 3 is the first region 3a are preferable embodiment.

The interface between the first region 3a and the p-type light-absorbing layer 3 which is not the first region 3a is a border where the condition of the concentration [cm$^{-3}$] of the n-type dopant, the condition of the concentration [cm$^{-3}$] of hole, and the condition of {concentration of the n-type dopant [cm$^{-3}$]}/{concentration of hole [cm$^{-3}$]} are not satisfied, and the border is not a crystallographic interface. When entirely of the p-type light-absorbing layer 3 is the first region 3a, the interface between the first region 3a and the p-type light-absorbing layer 3 which is not the first region 3a does not exist.

It is preferable that the p-type light-absorbing layer 3 including the first region 3a includes a second region 3b which is p+ (p plus) type on the p-electrode 2 side. A recombination is reduced, and the short-circuit current density is increased by providing the second region 3b.

The second region 3b is a region where the concentration of hole is $5.0 \times 10^{17}$ [cm$^{-3}$] or more and $1.0 \times 10^{20}$ [cm$^{-3}$] or less. The second region 3b may be included in the p-type light-absorbing layer 3 which is not the first region 3a. When the thickness of the second region is too thin, the effect of reducing the recombination may be decreased. When the thickness of the second region is too thick, it is not preferable that the short-circuit current is decreased since a quantum efficiency for forming photocarrier in the second region 3b is smaller than a quantum efficiency for forming photocarrier in other than the second region 3b. Therefore, the thickness of the second region 3b is preferably 0 [nm] or more and 100 nm or less, more preferably 1 [nm] or more and 100 [nm] or less, and still more preferably 10 [nm] or more and 100 [nm] or less.

When both the first region 3a and the second region 3b are included in the p-type light-absorbing layer 3, a concentration of hole of a region of the p-type light-absorbing layer 3 which is not the first region 3a nor the second region 3b is preferably 1 times or more and 100000 times or less of the concentration of hole of the first region 3a and 0.00001 times or more and 0.01 times or less of the concentration of hole of the second region 3b, more preferably 5 times or more and 100000 times or less of the concentration of hole of the first region 3a and 0.00001 times or more and 0.01 times or less of the concentration of hole of the second region 3b, and still more preferably 10 times or more and 100000 times or less of the concentration of hole of the first region 3a and 0.00001 times or more and 0.01 times or less of the concentration of hole of the second region 3b.

One or more kind of p-type dopant selected from the group consisting of the Si, Ge, N, and P is preferably included in the second region 3b. The concentration of p-type dopant contained in the second region 3b is preferably $5.0 \times 10^{17}$ [cm$^{-3}$] or more and $1.0 \times 10^{21}$ [cm$^{-3}$] or less and more preferably $1.0 \times 10^{18}$ [cm$^{-3}$] or more and $1.0 \times 10^{21}$ [cm$^{-3}$] or less.

Figure 3:
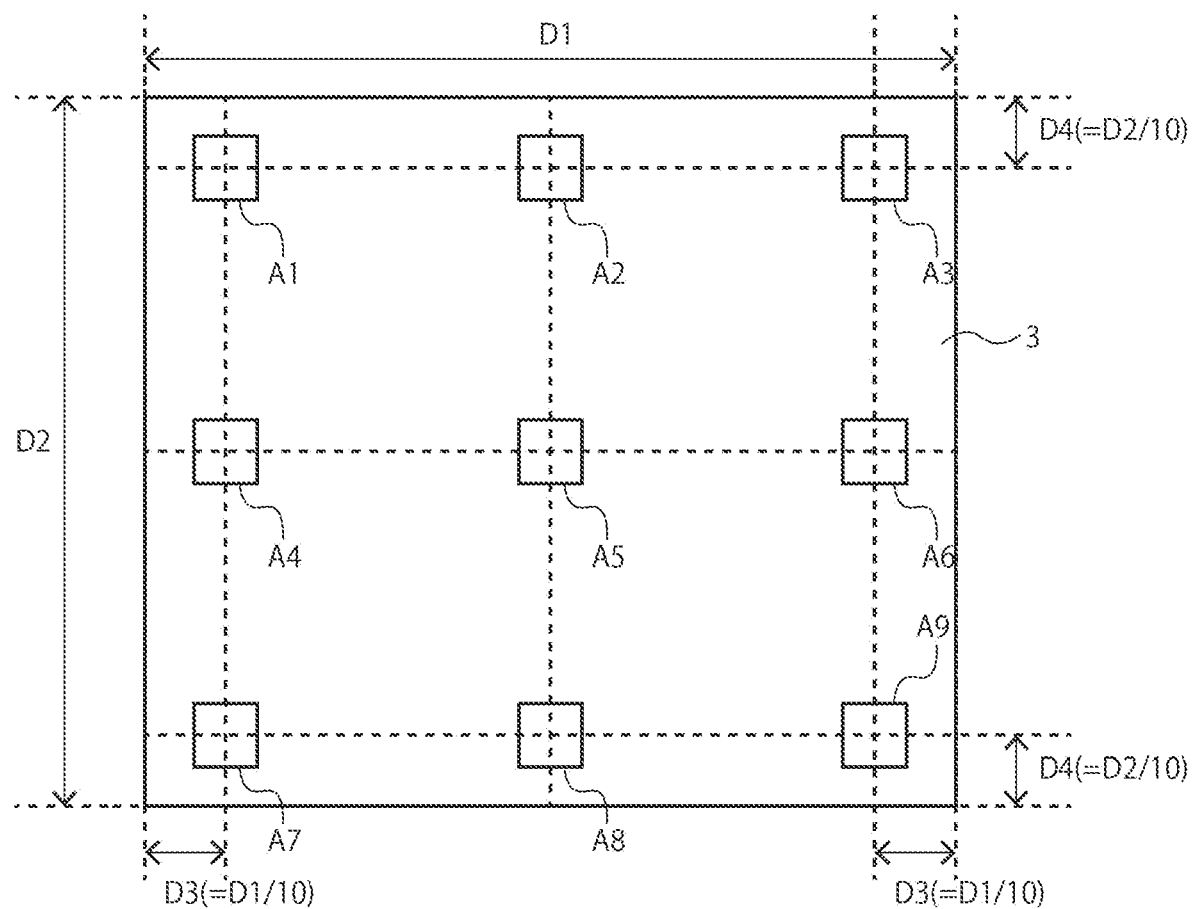
FIG. 3 is a diagram illustrating analysis spots of a solar cell according to an embodiment.

A composition of the compound of the p-type light-absorbing layer 3 is obtained by analyzing analysis spots (A1~A9) distributed as evenly as possible at equal intervals as represented in analysis spots of FIG. 3 by, for example, secondary ion mass spectrometry (SIMS). FIG. 3 is a schematic diagram of the solar cell 100 as viewed from the light incident side. D1 is a length of the p-type light-absorbing layer 3 in a width direction, and D2 is a length of the p-type light-absorbing layer 3 in a depth (longitudinal) direction. The analysis is performed, for example, from the surface of the n-type layer 4 toward the p-electrode 2.

When the thickness of the p-type light-absorbing layer 3 is $d_1$, the composition of the p-type light-absorbing layer 3 is an average value of the compositions at depths of $0.1d_1$, $0.2d_1$, $0.3d_1$, $0.4d_1$, $0.5d_1$, $0.6d_1$, $0.7d_1$, $0.8d_1$, and $0.9d_1$ from of the p-type light-absorbing layer 3 on p-electrode 2 side. When the surface of the p-type light-absorbing layer 3 is analyzed by SIMS, it is preferable that the average composition is obtained by analyzing the p-type light-absorbing layer 3 from $0.1d_1$ depth. The total compositions including the n-type dopant at depths of $0.1d_1$, $0.2d_1$, $0.3d_1$, $0.4d_1$, $0.5d_1$, $0.6d_1$, $0.7d_1$, $0.8d_1$, and $0.9d_1$ is obtained, and detailed profile of the n-type dopant is obtained by re-analyzing only the concentration of the n-type dopant by SIMS. A presumed presence location of the first region 3a and a presumed presence location in the p-type light-absorbing layer 3 and the concentration of n-type dopant in the entire p-type light-absorbing layer 3 can be obtained from the obtained concentration profile of the n-type dopant.

The concentration of hole of the p-type light-absorbing layer 3 is obtained by using the presumed presence location of the first region 3a and the presumed presence location obtained from the concentration of the n-type dopant. For example, when the thickness of the p-type light absorbing layer 3 is 6 μm and the first region 3a exists from the surface of the p-type light-absorbing layer 3 on the n-type layer 4 side until the depth at 4 μm, first, the concentration of hole of the p-type light-absorbing layer 3 itself is analyzed by, for example, grinding or etching the member from n-type layer 4 side toward the p-type light-absorbing layer 3 side. Next, the concentration of hole is analyzed, for example, for every 500 nm of removing thickness while removing the p-type light-absorbing layer 3 from the p-electrode 2 side of the p-type light-absorbing layer 3. Measurement accuracy is improved by changing the pitch of removing interval from 500 nm to 100 nm in analyzing the concentration of the hole. The region in which the conditions of the concentration of the n-type dopant and the concentration of the hole are satisfied is regarded as the first region 3a. Additionally, the concentration of the hole of the region of the p-type light-absorbing layer 3 excluding the first region 3a can be also obtained from the obtained concentration of hole.

The p-type light-absorbing layer 3 is preferably formed by sputtering or the like.

When the p-type light-absorbing layer 3 includes a compound having chalcopyrite structure, the compound having chalcopyrite structure is, for example, a compound including group 11 element (Cu, Ag), group 13 element (Al, Ga, In), and group 16 element (S, Se, Te). Zn or/and Cd is preferable as the n-type dopant for the compound having chalcopyrite structure.

When the p-type light-absorbing layer 3 includes a compound having kesterite structure, the compound having the kesterite structure is, for example, $Cu_2ZnSn(S,Se)_4$. Cd is preferable as the n-type dopant for the compound having kesterite structure.

When the p-type light-absorbing layer 3 includes a compound having stannite structure, the compound having the stannite structure is, for example, $Cu_2(Fe,Zn)Sn(S,Se)_4$. Cd is preferable as the n-type dopant for the compound having stannite structure.

When the p-type light-absorbing layer 3 includes a compound having perovskite structure, the compound having the perovskite structure is, for example, $CH_3NH_3PbX_3$ (X is one or more kind of halogen).

The n-type layer 4 is an n-type semiconductor layer. The n-type layer 4 is located between the p-type light-absorbing layer 3 and the n-electrode 5. The n-type layer 4 is in direct contact with a surface of the p-type light-absorbing layer 3 opposite to a surface in contact with the p-electrode 2. The n-type layer 4 is a semiconductor layer containing oxide including Ga or a semiconductor layer containing n-type cuprous oxide compound. The semiconductor layer containing oxide including Ga or the semiconductor layer containing n-type cuprous oxide compound forms pn-junction (pin junction when the mixture region is i type) with the p-type light absorbing layer 3. When the semiconductor layer containing oxide including Ga is used for the n-type layer 4, the solar cell is a hetero-junction solar cell. When the semiconductor layer containing n-type cuprous oxide compound is used for the n-type layer 4, the solar cell is a homo-junction solar cell. The n-type layer 4 may be a single layer of the semiconductor layer containing oxide including Ga or the semiconductor layer containing n-type cuprous oxide compound or multi layered thereof. The multi layered n-type layer 4 is, for example, semiconductor layers including a plurality of semiconductor layers each having different composition of oxide of Ga or semiconductor layers including a plurality of semiconductor layers each having n-type cuprous oxide compound containing different composition including oxide including Ga. Whether the solar cell is the hetero-junction solar cell or the homo-junction solar cell, the short circuit current density is theoretically improved since the depletion layer width expands, the short-circuit current density and the conversion efficiency is improved by providing the first region 3a in the hetero-junction solar cell and the homo-junction solar cell.

It is preferable that a compound (oxide) of Ga as a main component. The n-type layer 4 may be a mixture of the oxide having Ga as a main component and other oxide, a mixture of the oxide having Ga as a base doped with one or more element, or a mixture of the oxide having Ga as a base doped with one or more element and other oxide. The n-type layer 4 is one layer or stacked layers. It is preferable that Ga ratio to metal elements in the n-type layer is 50 atom % or more. The metal elements contained in the n-type layer 4 may be inclined from the p-type-light-absorbing layer 3 to the n-electrode 5.

It is preferable that the n-type layer 4 contains an oxide containing the element represented by M3 and Ga. The oxide including Ga as a main component is, for example, an oxide including the element represented by M3 and Ga. It is preferable that the n-type layer 4 includes an oxide including the element represented by M3 that is one or more elements selected from the group consisting of H, Sn, Sb, Cu, Ag, Li, Na, K, Cs, Rb, Al, In, Zn, Mg, Si, Ge, N, B, Ti, Hf, Zr, and Ca and Ga. The n-type layer 4 preferably includes 90 wt % or more and 100 wt % or less of the oxide including the element represented by M3 that is one or more elements selected from the group consisting of H, Sn, Sb, Cu, Ag, Li, Na, K, Cs, Rb, Al, In, Zn, Mg, Si, Ge, N, B, Ti, Hf, Zr, and Ca and Ga.

The compound including Ga as a main component is preferably an oxide including the M3 and Ga whose average composition is represented by $Ga_hM3_iO_j$. h, i, and j preferably satisfy $1.8 \leq h \leq 2.1$, $0 \leq i \leq 0.2$, and $2.9 \leq j \leq 3.1$.

It is preferable that 90 [wt %] or more and 100 [wt %] or less of the n-type layer 4 is the oxide including the M3 and Ga. It is more preferable that 95 [wt %] or more and 100 [wt %] or less of the n-type layer 4 is the oxide including the M3 and Ga. It is still more preferable that 98 [wt %] or more and 100 [wt %] or less of the n-type layer 4 is the oxide including the M3 and Ga. Cu included in the n-type layer 4 is not included in the raw material for forming the n-type layer 4, and Cu included in the p-type light absorbing layer 3 is dispersed to the n-type layer 4. When the other element is used for forming the p-type light-absorbing layer 3, the other element may be also dispersed to the n-type layer 4.

The thickness of the n-type layer 4 is typically 3 [nm] or more and 100 [nm] or less. When the thickness of the n-type layer 4 is less than 3 nm, a leakage current is generated in a case where coverage of the n-type layer 4 is poor, and characteristics may be deteriorated. When the coverage is good, the film thickness is not limited to the above film thickness. When the thickness of the n-type layer 4 exceeds 50 [nm], characteristics may be deteriorated due to an excessive increase in resistance of the n-type layer 4 the short-circuit current may be reduced due to a decrease in transmittance. Accordingly, the sum of the film thickness of the n-type layer 4 is more preferably 3 [nm] or more and 20 [nm] or less, and still more preferably 5 [nm] or more and 20 [nm] or less.

Figure 2:
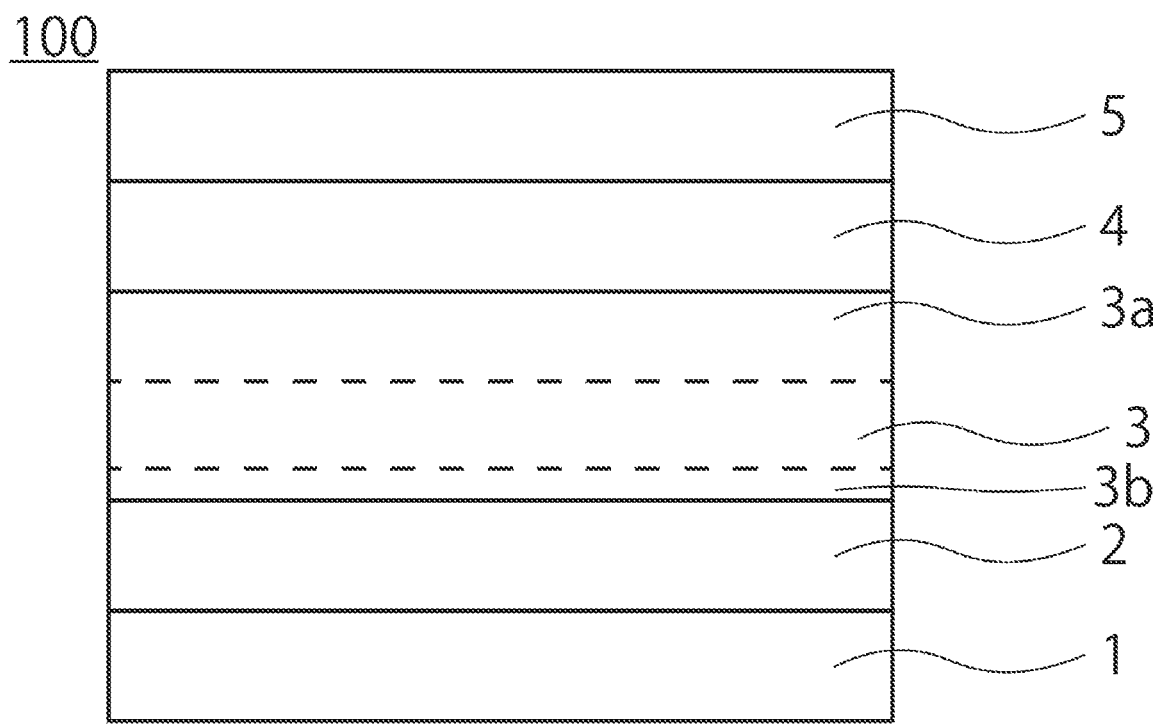
FIG. 2 is a schematic cross-sectional diagram of a solar cell according to an embodiment.

A composition of the compound of the n-type layer 4 is an average composition of the entire n-type layer 4 unless otherwise specified. When a thickness of the n-type layer 4 is $d_4$, the composition of the n-type layer 4 is an average value of the compositions at depths of $0.2d_4$, $0.5d_4$, and $0.8d_4$ from a surface (interface between the p-type light-absorbing layer 3 and the n-type layer 4) of the n-type layer 4 on the p-type light-absorbing layer 3 side. When the n-type layer 4 is very thin (for example, 5 nm or less), the composition at a depth of $0.5d_4$ from the surface of the n-type layer 4 on the p-type light-absorbing layer 3 side can be regarded as the composition of the entire n-type layer 4. In the analysis, analysis spots (A1~A9) distributed as evenly as possible at equal intervals as represented in analysis spots of FIG. 2 at each distance from the surface of the n-type layer 4 are analyzed by, for example, secondary ion mass spectrometry (SIMS). FIG. 3 is a schematic diagram of the solar cell 100 as viewed from the light incident side. D1 is a length of the n-type layer 4 in a width direction, and D2 is a length of the n-type layer 4 in a depth (longitudinal) direction.

When the p-type light-absorbing layer 3 does not include the cuprous oxide, an n-type oxide layer can be used as a n-type layer 4.

The n-electrode 5 is an electrode on the n-type layer 4 side having transparency to visible light. The n-type layer 4 is sandwiched between the n-electrode 5 and the p-type light-absorbing layer 3. An intermediate layer (not illustrated) can be provided between the n-type layer 4 and the n-electrode 5. It is preferable that a transparent conductive oxide film is used for the n-electrode 5. It is preferable that the transparent conductive oxide film used for the n-electrode 5 is one or more kinds of semiconductor conductive films selected from the group consisting of an indium tin oxide, an aluminum-doped zinc oxide, a boron-doped zinc oxide, a gallium-doped zinc oxide, an indium-doped zinc oxide, a titanium-doped indium oxide, an indium gallium zinc oxide, and a hydrogen-doped indium oxide. A dopant for a film of tin oxide or the like is not particularly limited as long as the dopant is one or more elements selected from the group consisting of In, Si, Ge, Ti, Cu, Sb, Nb, Ta, W, Mo, F, Cl, and the like. Graphene can be also used for the n-electrode 5. It is preferable that the graphene is stacked with Ag nano wires.

A thickness of the n-electrode 5 is obtained by cross-sectional observation with an electron microscope or a step profiler, and is not particularly limited, but is typically 50 [nm] or more and 2000 [nm] or less.

The n-electrode 5 is preferably formed by sputtering or the like.

Second Embodiment

Figure 4:
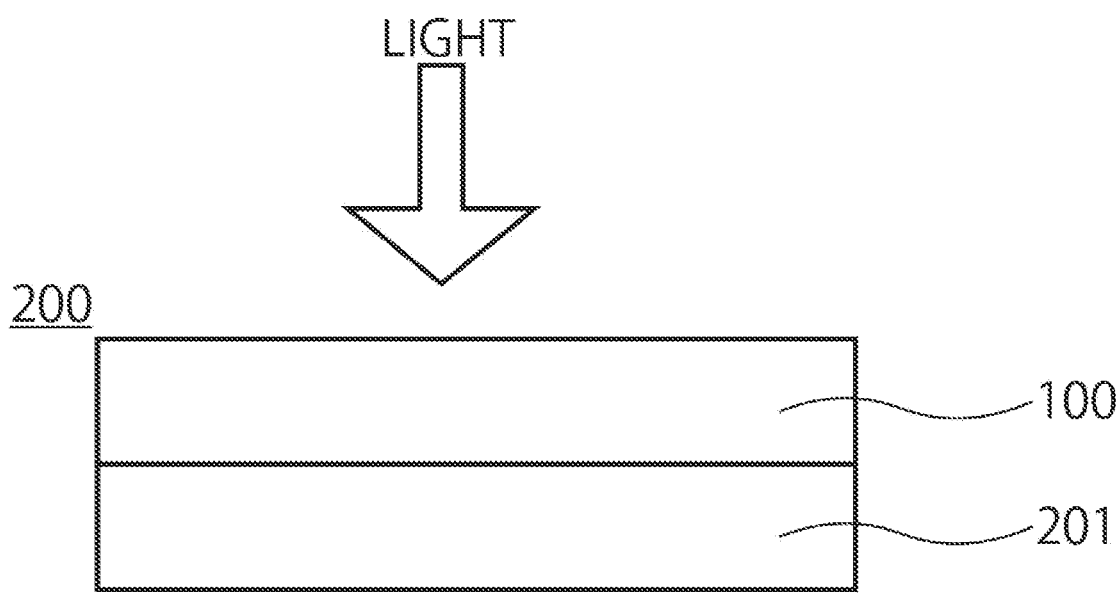
FIG. 4 is a cross-sectional diagram of a multi-junction solar cell according to an embodiment.

A second embodiment relates to a multi-junction solar cell. FIG. 4 illustrates a cross-sectional diagram of a multi-junction solar cell according to the second embodiment. The multi-junction solar cell 200 of FIG. 4 includes the solar cell (first solar cell) 100 according to the first embodiment on the light incident side and a second solar cell 201. The band gap of the p-type light-absorbing layer of the second solar cell 201 is smaller than the band gap of the light-absorbing layer 3 of the solar cell 100 according to the first embodiment. Incidentally, the multi-junction solar cell 200 according to the embodiment includes a solar cell in which three or more solar cells are bonded.

The band gap of the p-type light-absorbing layer 3 (cuprous oxide) of the first solar cell 100 according to the first embodiment is about 2.0 [eV] or more and 2.2 [eV] or less, and thus the band gap of the light-absorbing layer of the second solar cell 201 is preferably 1.0 [eV] or more and 1.6 [eV] or less. The light-absorbing layer of the second solar cell 201 is preferably selected from the group consisting of any one or more compound semiconductor layers among CIGS-based having a high In content and CdTe-based compound semiconductor layers, crystalline silicon and perovskite type compound.

Third Embodiment

Figure 5:
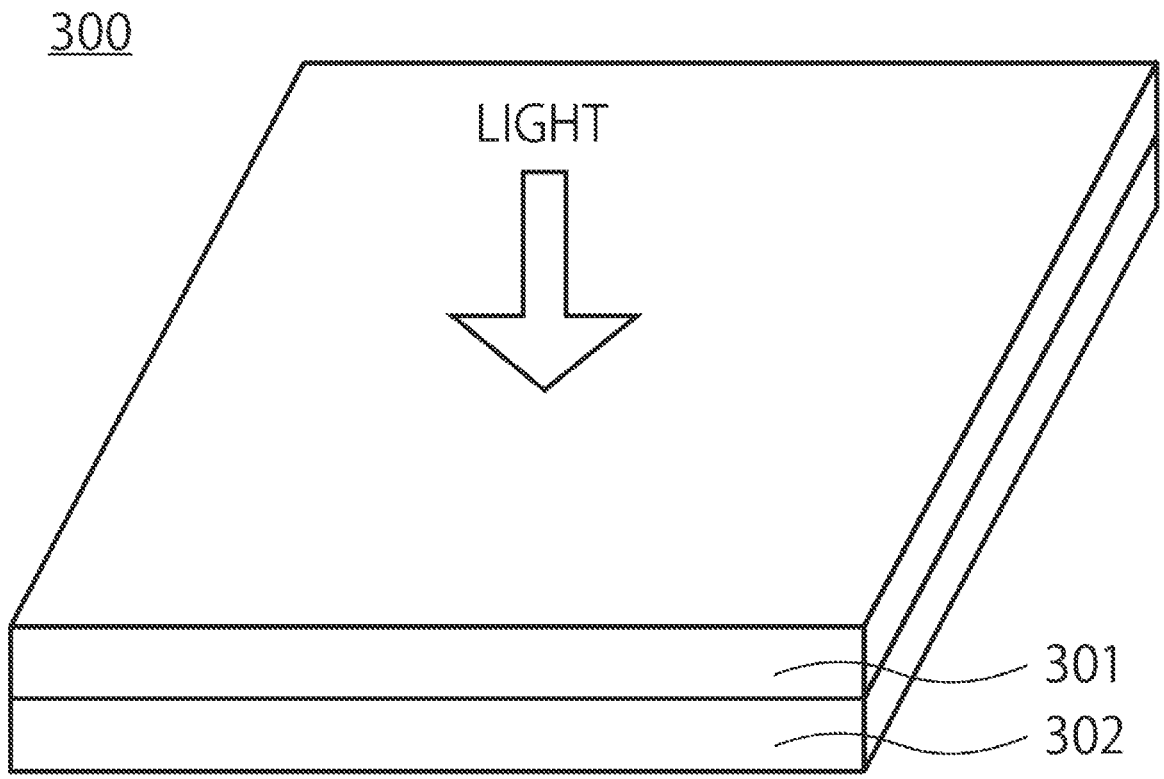
FIG. 5 is a perspective diagram of a solar cell module according to an embodiment.

A third embodiment relates to a solar cell module. FIG. 5 illustrates a perspective diagram of a solar cell module 300 according to the third embodiment. The solar cell module 300 in FIG. 5 is a solar cell module in which a first solar cell module 301 and a second solar cell module 302 are stacked one on the other. The first solar cell module 301 is on the light incident side and includes the solar cell 100 according to the first embodiment. It is preferable to use the second solar cell 201 in the second solar cell module 302.

Figure 6:
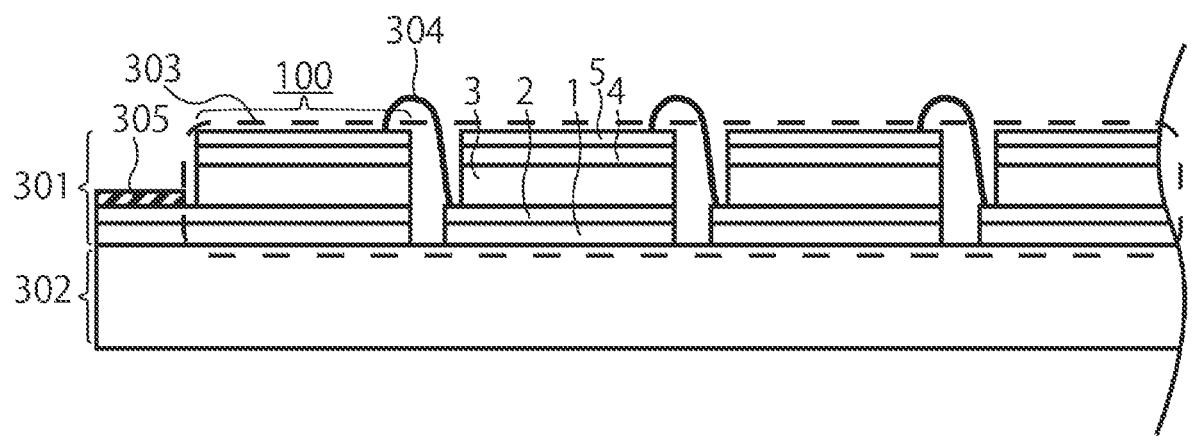
FIG. 6 is a cross-sectional diagram of a solar cell module according to an embodiment.

FIG. 6 illustrates a sectional diagram of the solar cell module 300. In FIG. 6, the structure of the first solar cell module 301 is illustrated in detail but the structure of the second solar cell module 302 is not illustrated. In the second solar cell module 302, the structure of the solar cell module is appropriately selected depending on the light-absorbing layer of the solar cell to be used. In the solar cell module 300 in FIG. 6, a plurality of submodules 303 in which a plurality of solar cells 100 are arranged in the horizontal direction and electrically connected to each other by a wiring 304 in series and which is enclosed by a broken line are included and the plurality of submodules 303 are electrically connected to each other in parallel or in series. Adjacent submodules are electrically connected by a busbar 305.

In adjacent solar cells 100, the n-electrode 5 on the upper side and the p-electrode 2 on the lower side are connected by the wiring 304. The solar cell according to the third embodiment includes the substrate 1, p-electrode 2, p-type light-absorbing layer 3, n-type layer 4, and n-electrode 5 as well as the solar cell 100 according to the first embodiment. Both ends of the solar cell 100 in the submodule 303 are connected to the busbar 305, the busbar 305 is preferably configured to electrically connect a plurality of submodules 303 in parallel or in series and adjust the output voltage with the second solar cell module 302. Incidentally, the connection system of the solar cell 100 shown in the third embodiment is an example, the solar cell module can be configured by other connection systems.

Fourth Embodiment

Figure 7:
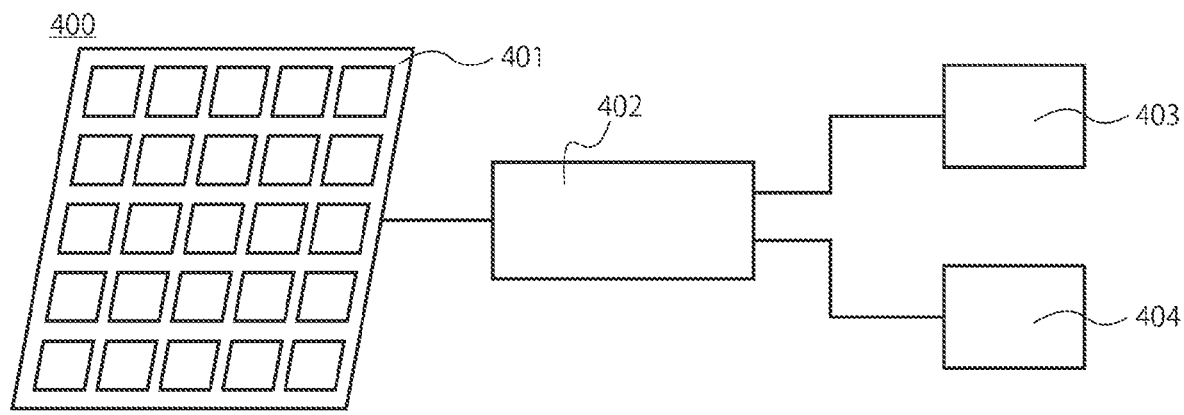
FIG. 7 is a structural view of a photovoltaic power generation system according to an embodiment.

A fourth embodiment relates to a solar photovoltaic power generation system. The solar cell module 300 according to the fourth embodiment can be used as a generator which generates electric power in the solar photovoltaic power generation system according to the fourth embodiment. The solar photovoltaic power generation system according to the embodiment generates electric power using a solar cell module and specifically includes a solar cell module which generates electric power, a unit which converts the generated electricity into electric power, and a power storage unit which stores the generated electricity or a load which consumes the generated electricity. FIG. 7 illustrates a configuration diagram of a solar photovoltaic power generation system 400 according to the embodiment. The solar photovoltaic power generation system in FIG. 7 includes a solar cell module 401 (300), a converter 402, a storage battery 403, and a load 404. Either of the storage battery 403 or the load 404 may be omitted. The load 404 may be configured to be able to utilize the electric energy stored in the storage battery 403. The converter 402 is an apparatus including a circuit or a device which performs power conversion such as voltage transformation or DC-AC conversion such as a DC-DC converter, DC-AC-converter, AC-AC-converter and the like. As the configuration of the converter 402, a suitable configuration may be adopted depending on the configuration of the generated voltage, the storage battery 403, and the load 404.

The solar cells included in the submodule 303 which receives light included in the submodule 303 generate electric power, the electric energy is converted by the converter 402 and stored in the storage battery 403 or consumed by the load 404. It is preferable to provide the solar cell module 401 with a sunlight tracking and driving apparatus for constantly directing the solar cell module 401 toward the sun or a light collector which collects sunlight or to add an apparatus or the like for improving the power generation efficiency.

It is preferable that the solar photovoltaic power generation system 400 is used for immovable property such as dwellings, commercial facilities, and factories or for movable property such as vehicles, aircraft, and electronic devices. The electric power generation amount is expected to increase as the solar cell having an excellent conversion efficiency according to the embodiment is used in the solar cell module 401.

Figure 8:
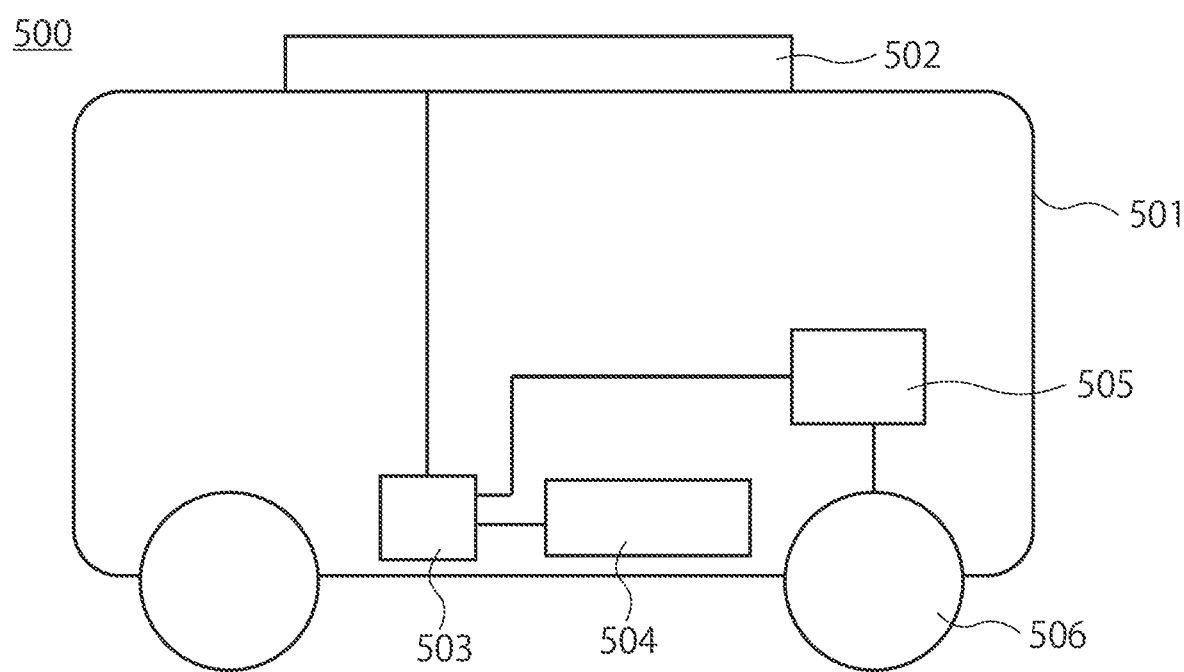
FIG. 8 is a conceptual diagram of a vehicle according to an embodiment.

A vehicle is described as an example of utilization of the solar photovoltaic power generation system 400. FIG. 8 illustrates a conceptual configuration diagram of a vehicle 500. The vehicle 500 in FIG. 8 includes a vehicle body 501, a solar cell module 502, a power converter 503, a storage battery 504, a motor 505, and tires (wheels) 506. The electric power generated by the solar cell module 502 provided on the upper portion of the vehicle body 501 is converted by the power converter 503 and is charged in the storage battery 504 or consumed by a load such as the motor 505. The vehicle 500 can be moved by rotating the tires (wheels) 506 by the motor 505 using the electric power supplied from the solar cell module 502 or the storage battery 504. The solar cell module 502 may not be a multi-junction type but may be configured only of such as the first solar cell module including the solar cell 100 according to the first embodiment. In the case of adopting a transparent solar cell module 502, it is also preferable to use the solar cell module 502 as a window for generating electric power on the side surface of the vehicle body 501 in addition to the upper portion of the vehicle body 501.

Figure 9:
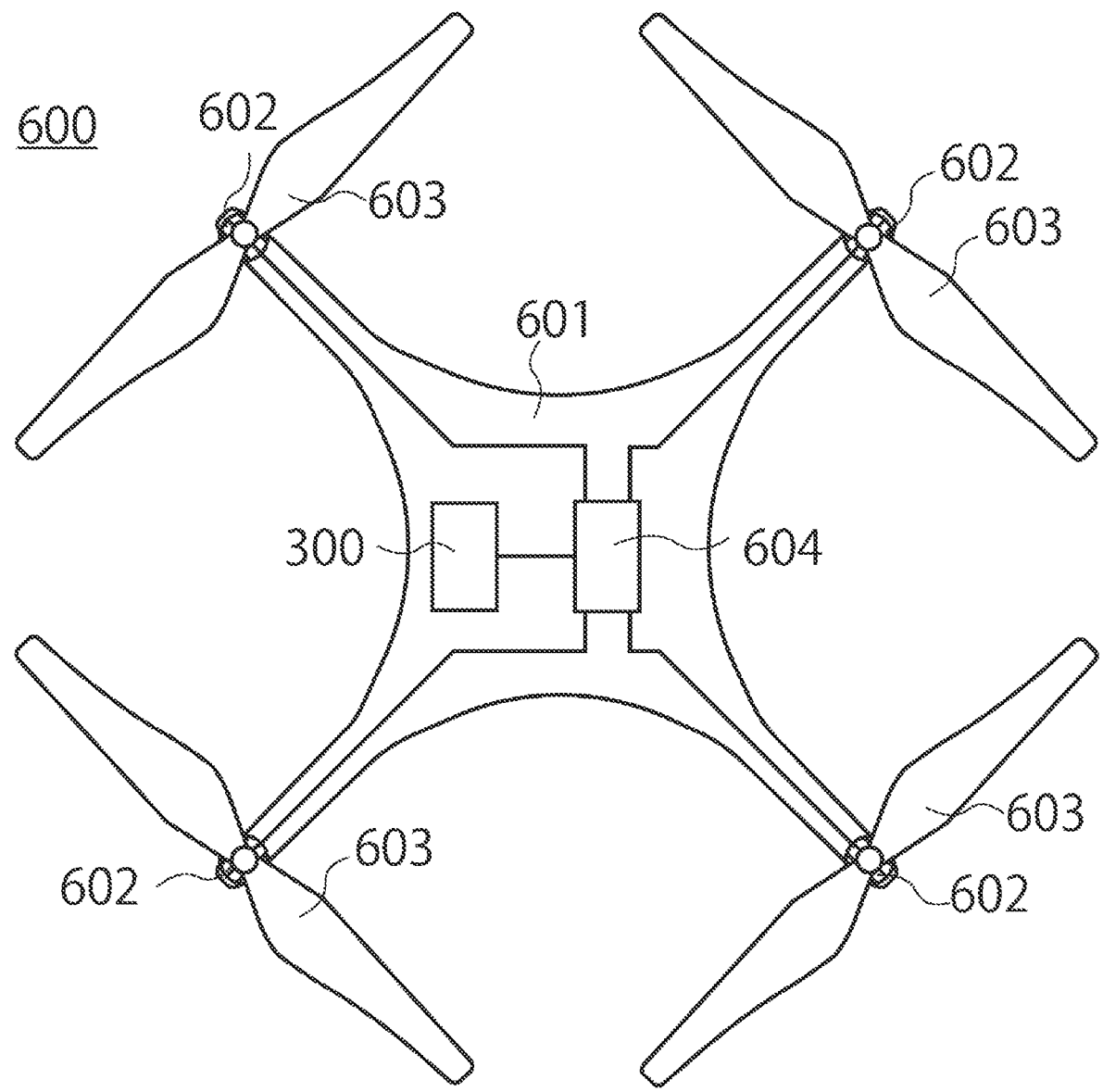
FIG. 9 is conceptual diagram of a flying object according to an embodiment.

A flying object (multi-copter) is described as an example of utilization of the solar photovoltaic power generation system 400. The flying object uses a solar cell module 300. A configuration of the flying object according to the present embodiment will be briefly described using a schematic view of a flying object 600 (quadcopter) of FIG. 9. The flying object 600 includes a solar cell module 401, a body frame 601, motors 602, rotary wings 603, and a control unit 604. The solar cell module 401, the motors 602, the rotary wings 603, and the control unit 604 are disposed in the body frame 601. The control unit 604 converts power output from the solar cell module 401 and adjusts output. The motors 602 rotate the rotary wings 603 using the power output from the solar cell module 401. By using the flying object 600 with the present configuration having the solar cell module 401 according to the embodiment, a flying object that can fly using more electric power is provided.

Hereinafter, the present disclosure will be described more specifically based on Examples, but the present disclosure is not limited to the following Examples.

Example A-1~A-9, Comparative Example A-1~A-15

Simulations were performed under the following conditions. The solar cell 100 is configured to include the p-type light-absorbing layer 3, the n-type layer 4, and the n-electrode 5 stacked in this order. An open-circuit voltage [V], a short-circuit current density [mA/cm$^3$], a fill factor, and conversion efficiency is obtained by performing the simulation. The substrate 1 is not considered in the simulation, but simulation results that the substrate 1 is considered are as well as the simulation results that the substrate 1 is considered since the presence or absence of the substrate 1 is not considered in the simulation. The p-electrode 2 is not considered in the simulation. The simulation software has a limitation of number of layers of the solar cell. When the p-type light-absorbing layer 3 forms ohmic contact with the p-electrode 2, is can be evaluated as a resistance value of a series resistance Rs of the solar cell 100 without considering a specific layer construction of the p-electrode 2. Therefore, the simulations of the solar cell 100 without the p-electrode 2 is performed under the assumption that the p-type light-absorbing layer 3 forms ohmic contact with the p-electrode 2 (assumption that the series resistance Rs reflects the sheet resistance of the p-electrode 2 and an interface resistance).

p-type light-absorbing layer 3: $Cu_2O$ layer, Conditions of defect level, concentration of hole of the first region 3a where the n-type dopant is doped, and the thickness of the first region 3a are shown in a table of FIG. 10.

n-type layer 4: $Ga_2O_3$ layer, thickness 11 [nm].

n-electrode 5: stacked layers of $Zn_{0.80}Sn_{0.20}O_{1.2}$ layer (thickness 11 nm) and Al added ZnO layer (thickness 57 [nm]).

n-type dopant: Cl.

Series resistance Rs=8 [Ω·cm]

Simulation method: SCAPS, dissolving Poisson equation and continuity equation.

In the table of the FIG. 10, each example and number of comparative example of comparison (control) is also shown. The concentration of hole of the comparative example whose concentration of the n-type dopant is 0 represents a concentration of hole that n-type dopant is not doped. The concentration of hole of examples of non-doped p-type light-absorbing layer 3 represents the concentration of hole of comparison of comparative example. The open-circuit voltage [V], the short-circuit current density [mA/cm$^3$], the fill factor, and the conversion efficiency are shown in a table of FIG. 11.

In example A, the thickness of the first region 3a is evaluated. When the thickness of the p-type light-absorbing layer 3 is 4000 nm and 6000 nm, the short-circuit current density and the conversion efficiency whose thickness of the first region 3a is thicker are improved. When the thickness of the first region 3a is thin, the improving of the short-circuit current density and the conversion efficiency, and the thickness of the first region is preferably 1500 nm or more. Although, when the thickness of the p-type light-absorbing layer 3 is thick and the thickness of the first region 3a is too thick, decreasing of the fill factor is confirmed since the efficiency of recombination in the bulk becomes large. When the thickness of the p-type light-absorbing layer 3 is 6000 nm, the conversion efficiency is best improved where the thickness of the first region is 4000 nm.

(Example B-1~B-15, Comparative Example B-1~B-13) Simulations were performed under the following conditions. The solar cell 100 is configured to include the p-type light-absorbing layer 3, the n-type layer 4, and the n-electrode 5 stacked in this order as well as example A. An open-circuit voltage [V], a short-circuit current density [mA/cm$^3$], a fill factor, and conversion efficiency is obtained by performing the simulation. The Cu$_2$O layer is used as the p-type light-absorbing layer 3 as well as example A, and conditions of defect level, concentration of hole of the first region 3a where the n-type dopant is doped, and the thickness of the first region 3a are shown in a table of FIG. 12. The open-circuit voltage [V], the short-circuit current density [mA/cm$^3$], the fill factor, and the conversion efficiency are shown in a table of FIG. 13.

In example B, the concentration of n-type dopant is evaluated. Since the purpose is to expand the depletion layer width, the closer the first region 3a is to i type, the higher the conversion efficiency. Although, when the first region 3a becomes obviously n-type, the short-circuit current density is decreased. When the first region 3a is obviously n-type, the thicker the first region 3a, the greater the improvement in the short-circuit current density. When "the concentration of n-type dopant"/"the concentration of hole" is less than 10 (for example comparative example B-1 to comparative example B-5), the fill factor tends to be decreased. When "the concentration of n-type dopant"/"the concentration of hole" is 10 or more (for example example B-1 to example B-4), the fill factor tends to be increased, and increasing of the short-circuit current density is also confirmed. When "the concentration of n-type dopant"/"the concentration of hole" is more than $5.0 \times 10^{26}$, the short-circuit current density and the fill factor tend to be decreased.

Example C-1~C-5, Comparative Example C-1~C-27

Simulations were performed under the following conditions. The solar cell 100 is configured to include the p-type light-absorbing layer 3, the n-type layer 4, and the n-electrode 5 stacked in this order as well as example A. An open-circuit voltage [V], a short-circuit current density [mA/cm$^3$], a fill factor, and conversion efficiency is obtained by performing the simulation. The Cu$_2$O layer is used as the p-type light-absorbing layer 3 as well as example A, and conditions of defect level, concentration of hole of the first region 3a where the n-type dopant is doped, and the thickness of the first region 3a are shown in tables of FIG. 14 and FIG. 16. The open-circuit voltage [V], the short-circuit current density [mA/cm$^3$], the fill factor, and the conversion efficiency are shown in tables of FIG. 15 and FIG. 17.

In example C, the evaluation is done by changing the concentration of hole before doping of the n-type dopant and the concentration of the n-type dopant as shown in FIG. 14, FIG. 15, FIG. 16, and FIG. 17. When the concentration of hole of the p-type light-absorbing layer 3 before doping is low, the improving effect of the short-circuit current density is low since the depletion layer width is already wide. When the concentration of hole of the p-type light-absorbing layer 3 is $10^{17}$ [cm$^{-3}$] or more, the short-circuit current density and the fill factor is decreased since the depletion layer width is not expanded and the recombination in bulk is increased where the "the concentration of n-type dopant"/"the concentration of hole" is $10^{21}$ or less. When the concentration of hole of the p-type light-absorbing layer 3 before doping is high, middle, or low, a relationship between the value of the concentration of the hole and the improving of the short-circuit current density and the conversion efficiency is not confirmed, but a doping condition to improve the short-circuit current density and the conversion efficiency is revealed with considering the concentration of the n-type dopant and considering also "the concentration of n-type dopant"/"the concentration of hole". When the doping condition that is revealed with considering also "the concentration of n-type dopant"/"the concentration of hole" is satisfied, the concentration of hole of the p-type light-absorbing layer 3 before doping is $10^{14}$ or more and $10^{19}$ or less, the short-circuit current density and the conversion efficiency are improved. When the short-circuit current density and the conversion efficiency of the solar cell before doping are high, the short-circuit current density and the conversion efficiency are greatly improved by providing the first region 3a, and providing the first region 3a increases the conversion efficiency of the solar cell which has a high conversion efficiency. When "the concentration of n-type dopant"/"the concentration of hole" is less than 10 or more than $5.0 \times 10^{26}$, the conversion efficiency is low or not high enough since the short-circuit current density is low and the like. When "the concentration of n-type dopant"/"the concentration of hole" is 10 or more and $5.0 \times 10^{26}$ or less and the concentration of the n-type dopant is $1.0 \times 10^{14}$ [cm$^{-3}$] or more and $1.0 \times 10^{19}$ [cm$^{-3}$] or less, improving of the short-circuit current density and the conversion efficiency is confirmed.

Example D-1~D-4, Comparative Example D1

Simulations were performed under the following conditions. The solar cell 100 is configured to include the p-type light-absorbing layer 3, the n-type layer 4, and the n-electrode 5 stacked in this order as well as example A. An open-circuit voltage [V], a short-circuit current density [mA/cm$^3$], a fill factor, and conversion efficiency is obtained by performing the simulation. The Cu$_2$O layer is used as the p-type light-absorbing layer 3 as well as example A, and conditions of defect level, concentration of hole of the first region 3a where the n-type dopant is doped, and the thickness of the first region 3a are shown in a table of FIG. 18. The open-circuit voltage [V], the short-circuit current density [mA/cm$^3$], the fill factor, and the conversion efficiency are shown in a table of FIG. 19.

In example D, the second region 3b is evaluated. When the second region 3b exists, in other words a p+ region exists in the p-type light-absorbing layer 3 on the rear surface side, the concentration of hole on the rear surface side is increased. A recombination on the rear surface side is decreased and the short-circuit current density is increased since the concentration of hole is locally increased on the rear surface side. Some elements are expressed only by element symbols thereof.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solar cell comprising:
a p-electrode;
an n-electrode;
a p-type light-absorbing layer on the p-electrode; and
an n-type layer between the p-type light-absorbing layer and the n-electrode,
wherein a first region is included in the p-type light-absorbing layer from a surface on the n-type layer side toward the p-electrode,
wherein the first region includes n-type dopant dispersed within the first region from the n-type layer side to the p-electrode,
wherein a thickness of the first region is 1500 nm or more and equal to 0.9 of a thickness of the p-type light-absorbing layer nm or less,
wherein a concentration of the n-type dopant of the first region is $1.0 \times 10^{14}$ cm$^{-3}$ or more and $1.0 \times 10^{19}$ cm$^{-3}$ or less, and
wherein the concentration of the n-type dopant of the first region and a concentration of holes of the first region satisfy 10 $ (the concentration of the n-type dopant/the concentration of holes)≤$5.0 \times 10^{26}$.

2. The solar cell according to claim 1,
wherein a thickness of the p-type light-absorbing layer is 2000 nm or more and 15000 nm or less, and
wherein the thickness of the first region is 1000 nm or more and equal to 0.9 of the thickness of the p-type light-absorbing layer nm or less.

3. The solar cell according to claim 1,
wherein thickness of the p-type light-absorbing layer is 4000 nm or more and 10000 nm or less,
wherein the thickness of the p-type light-absorbing layer is denoted by t, and wherein the thickness of the first region is ((t-4000)/2)+1000 nm or more and 0.9t nm or less.

4. The solar cell according to claim 1,
wherein a thickness of the p-type light-absorbing layer is 4000 nm or more and 10000 nm or less,
wherein the thickness of the p-type light-absorbing layer is denoted by t, and
wherein the thickness of the first region is ((t-2000)/2)+1000 nm or more and 0.9t nm or less.

5. The solar cell according to claim 1,
wherein a thickness of the p-type light-absorbing layer is 4000 nm or more and 10000 nm or less,
wherein the thickness of the p-type light-absorbing layer is denoted by t, and
wherein the thickness of the first region is ((t-2000)/2)+2000 nm or more and 0.9t nm or less.

6. The solar cell according to claim 1,
wherein a concentration of holes of the first region is $4.0 \times 10^{-12}$ cm$^{-3}$ or more and $9.0 \times 10^{13}$ cm$^{-3}$ or less.

7. The solar cell according to claim 1,
wherein the concentration cm$^{-3}$ of the n-type dopant of the first region is $9.0 \times 10^{14}$ cm$^{-3}$ or more and $1.0 \times 10^{17}$ cm$^{-3}$ or less, and
wherein a concentration of holes of the first region is $5.0 \times 10^{-11}$ cm$^{-3}$ or more and $2.0 \times 10^{6}$ cm$^{-3}$ or less.

8. The solar cell according to claim 1,
wherein the n-type dopant is one or more elements selected from the group consisting of Cl, F, Br, I, Mn, Tc, and Re.

9. The solar cell according to claim 1,
wherein the n-type dopant is one or more elements selected from the group consisting of Cl, F, Br, and I.

10. The solar cell according to claim 1,
wherein the concentration of the n-type dopant of the first region is inclined from the n-type layer side to the p-electrode side.

11. The solar cell according to claim 1,
wherein the p-type light-absorbing layer includes a second region which is p+ type on the p-electrode side.

12. The solar cell according to claim 1,
wherein when the amount ratio of all metal elements contained in the p-type light-absorbing layer is expressed as 100%, the amount of copper element contained in the p-type light-absorbing layer is preferably 95% or more and 100% or less.

13. The solar cell according to claim 1,
wherein 95 wt % or more and 100 wt % or less of the p-type light-absorbing layer is a cuprous oxide compound.

14. The solar cell according to claim 1,
wherein the n-type dopant includes Cl.

15. A multi-junction solar cell comprising:
the solar cell according to claim 1.

16. A solar cell module comprising:
the solar cell according to claim 1.

17. A photovoltaic power generation system comprising:
the solar cell module according to claim 16 which generates power.

18. The solar cell according to claim 1,
wherein a concentration of holes in a region of the p-type light absorbing layer which is not the first region is 10 times or more and 100000 times or less of the concentration of holes of the first region.

19. The solar cell according to claim 1,
wherein a non-first region of the p-type light absorbing layer which is not the first region is included, and
wherein a concentration of the n-type dopant of the non-first region and a concentration of holes of the non-first region satisfy 10≤(the concentration of the n-type dopant/the concentration of holes)≤$5.0 \times 10^{26}$.

20. The solar cell according to claim 1, wherein the n-type dopant is dispersed within the first region such the n-type layer side of the first region has a higher concentration of the n-type dopant dispersed therein than a p-electrode side of the first region.

* * * * *